(12) United States Patent
Vargantwar

(10) Patent No.: US 8,472,382 B1
(45) Date of Patent: *Jun. 25, 2013

(54) ADAPTIVE VIRTUAL TERMINATION TARGET

(75) Inventor: Sachin R. Vargantwar, Overland Park, KS (US)

(73) Assignee: Sprint Spectrum L.P., Overland Park, KS (US)

( * ) Notice: Subject to any disclaimer, the term of this patent is extended or adjusted under 35 U.S.C. 154(b) by 309 days.

This patent is subject to a terminal disclaimer.

(21) Appl. No.: 12/943,424

(22) Filed: Nov. 10, 2010

(51) Int. Cl.
*H04W 4/00* (2009.01)
*H04L 1/00* (2006.01)
*H04B 1/00* (2006.01)

(52) U.S. Cl.
USPC ......... 370/328; 375/346; 455/63.1; 455/296; 714/746

(58) Field of Classification Search
None
See application file for complete search history.

(56) References Cited

U.S. PATENT DOCUMENTS

| | | | |
|---|---|---|---|
| 5,412,341 A | 5/1995 | Walczak | |
| 5,502,723 A * | 3/1996 | Sanders | 370/352 |
| 6,320,852 B1 * | 11/2001 | Obuchi et al. | 370/328 |
| 6,697,343 B1 * | 2/2004 | Kamel et al. | 370/311 |
| 6,754,191 B1 | 6/2004 | Paranchych et al. | |
| 7,215,652 B1 * | 5/2007 | Foley et al. | 370/319 |
| 2002/0001287 A1 * | 1/2002 | Bergenwall et al. | 370/230 |
| 2003/0040274 A1 | 2/2003 | Dai et al. | |
| 2004/0170192 A1 | 9/2004 | Herrmann | |
| 2005/0143012 A1 * | 6/2005 | Gu et al. | 455/67.13 |
| 2005/0152302 A1 | 7/2005 | Takahashi et al. | |
| 2006/0141935 A1 * | 6/2006 | Hou et al. | 455/63.1 |
| 2007/0168577 A1 | 7/2007 | Kim et al. | |
| 2008/0080424 A1 | 4/2008 | Torsner et al. | |
| 2008/0108366 A1 | 5/2008 | Hu | |
| 2008/0220791 A1 | 9/2008 | Cho et al. | |
| 2008/0267134 A1 | 10/2008 | Cheng et al. | |
| 2008/0282133 A1 * | 11/2008 | Lo et al. | 714/786 |
| 2008/0320527 A1 | 12/2008 | Bachu et al. | |
| 2009/0082054 A1 | 3/2009 | Li et al. | |
| 2009/0197601 A1 | 8/2009 | Kim et al. | |
| 2010/0061496 A1 | 3/2010 | Black et al. | |
| 2010/0091693 A1 | 4/2010 | Pelletier et al. | |
| 2010/0142479 A1 | 6/2010 | Black et al. | |
| 2010/0220673 A1 | 9/2010 | Hui et al. | |
| 2011/0019705 A1 | 1/2011 | Adams et al. | |
| 2011/0143805 A1 | 6/2011 | Ramasamy et al. | |
| 2011/0212731 A1 | 9/2011 | Lee et al. | |

OTHER PUBLICATIONS

Black et al., "Interference Cancellation Techniques for CDMA2000 1x Reverse Link", IEEE GLOBECOM 2009 proceedings, 2009.*
Office Action in U.S. Appl. No. 12/815,100 mailed May 10, 2012.
Office Action in U.S. Appl. No. 12/781,898 mailed Sep. 18, 2012.

(Continued)

*Primary Examiner* — Timothy J Weidner

(57) ABSTRACT

A method and system is disclosed for dynamic adjustment of extended frame decoding interval duration based on aggregate reverse-link error rate. In accordance with an example embodiment, upon determining that a frame transmission from an access terminal has not been successfully decoded during a nominal frame period, a base station will commence an extended decoding interval. The base station will also determine a duration for the extended decoding interval based on a measured an aggregate reverse-link error rate for transmissions from access terminals communicating with the base station. The base station will use the determined duration for the extended decoding interval. The determination will be made so as to increase the likelihood the extended decoding interval will result in a successful decoding of a frame of data.

25 Claims, 7 Drawing Sheets

OTHER PUBLICATIONS

Notice of Allowance in U.S. Appl. No. 12/815,100 mailed Aug. 16, 2012.
Unpublished U.S. Appl. No. 12/815,100, entitled "Enhanced Virtual Termination Target Mechanism" filed Jun. 14, 2010 in the name of Sachin R. Vargantwar.
Unpublished U.S. Appl. No. 12/817,853, entitled Dynamic Virtual Termination Target Based on RF Conditions filed Jun. 17, 2010 in the name of Sachin R. Vargantwar.
Unpublished U.S. Appl. No. 12/781,898, entitled "Power Control Setpoint Based on Virtual Termination Target" filed May 18, 2010 in the name of Sachin R. Vargantwar.
Office Action in U.S. Appl. No. 12/817,853 mailed Jan. 17, 2013.
Komine, A sturdy on optimal target of synchronous H-ARQ for next generation cellular system, Jul. 2008.

* cited by examiner

ADAPTIVE VIRTUAL TERMINATION TARGET

BACKGROUND

In a typical cellular radio communication system (wireless communication system), an area is divided geographically into a number of cell sites, each defined by a radio frequency (RF) radiation pattern from a respective base transceiver station (BTS) antenna. The base station antennas in the cells are in turn coupled to a base station controller (BSC), which is then coupled to a telecommunications switch or gateway, such as a mobile switching center (MSC) and/or a packet data serving node (PDSN) for instance. The switch or gateway may then be coupled with a transport network, such as the PSTN or a packet-switched network (e.g., the Internet).

When an access terminal (such as a cellular telephone, pager, or appropriately equipped portable computer, for instance) is positioned in a cell, the access terminal (also referred to herein by "AT") communicates via an RF air interface with the BTS antenna of the cell. Consequently, a communication path is established between the AT and the transport network, via the air interface, the BTS, the BSC and the switch or gateway. Functioning collectively to provide wireless (i.e., RF) access to services and transport in the wireless communication system, the BTS, BSC, MSC, and PDSN, comprise (possibly with additional components) what is typically referred as a Radio Access Network (RAN).

As the demand for wireless communications has grown, the volume of call traffic in most cell sites has correspondingly increased. To help manage the call traffic, most cells in a wireless network are usually further divided geographically into a number of sectors, each defined respectively by radiation patterns from directional antenna components of the respective BTS, or by respective BTS antennas. These sectors can be referred to as "physical sectors," since they are physical areas of a cell site. Therefore, at any given instant, an access terminal in a wireless network will typically be positioned in a given physical sector and will be able to communicate with the transport network via the BTS serving that physical sector.

As an access terminal moves between wireless coverage areas of a wireless communication system, such as between cells or sectors, or when network conditions change or for other reasons, the AT may "hand off" from operating in one coverage area to operating in another coverage area. In a usual case, this handoff process is triggered by the access terminal monitoring the signal strength of various nearby available coverage areas, and the access terminal or the BSC (or other controlling network entity) determining when one or more threshold criteria are met. For instance, the AT may continuously monitor signal strength from various available sectors and notify the BSC when a given sector has a signal strength that is sufficiently higher than the sector in which the AT is currently operating. The BSC may then direct the AT to hand off to that other sector.

In some wireless communication systems or markets, a wireless service provider may implement more than one type of air interface protocol. For example, a carrier may support one or another version of CDMA, such as EIA/TIA/IS-2000 Rel. 0, A, and CDMA 2000 Spread Spectrum Systems Revision E (either hereafter referred to generally as "IS-2000") for both circuit-cellular voice and data traffic, as well as a more exclusively packet-data-oriented protocol such as EIA/TIA/IS-856 Rel. 0, A, or other version thereof (hereafter "IS-856"). Access terminals operating in such systems may be capable of communication with either or both protocols, and may further be capable of handing off between them, in addition to being able to hand off between various configurations of coverage areas.

OVERVIEW

An AT receives data from a base station on a "forward link" and sends data to the base station on a "reverse link." Hence, on the forward link, the base station transmits and the access terminal receives, while on the reverse link, the access terminal transmits and the base station receives. Under CDMA and related protocols, the transmission power of a "sending entity" (base station on the forward link, access terminal on the reverse link) is adjusted according to an adaptive power-control protocol that uses a form of feedback from a "receiving entity" (access terminal on the forward link, base station on the reverse link). Specifically, the receiving entity monitors an error rate of data received from a particular sending entity in order to responsively set a target power level of received power from the particular sending entity that needs to be achieved in order to maintain the error rate at some preset, acceptable level. As operating conditions change, the receiving entity may adjust the target power level accordingly. The receiving entity also continually compares the actual received power from the particular sending entity with the target power level, and then sends power-control commands to the particular sending entity that instruct the particular sending entity to adjust its transmission power level so as to achieve the target power level, as measured at the receiving entity.

The error-rate monitoring and setting of the target power level are carried out on a time scale that is long compared with that used for sending the power-control commands. Thus, the setting of the target power level is aimed at responding to relatively gradual changes in received-power requirements, while the power-control commands are aimed at relatively rapid achievement of received-power requirements once they have been determined according to the target power level. As discussed below, the target power level corresponds to a parameter that is commonly referred to as a "setpoint."

Each power-control command is typically either a "power-increment" command, instructing the sending entity to increase its transmission power by a small amount, or a "power-decrement" command, instructing the sending entity to decrease its transmission power by a small amount. In practice, the receiving entity sends a continuous stream or sequence of periodic power-control commands to the sending entity. The process of achieving the received-power at the target power level at the receiving entity can be thought of conceptually as a sort of "coarse" adjustment that brings the actual received power to near-convergence with the target power level, followed by continuous "fine" adjustments aimed at keeping the actual received power very close to the target power level (until another coarse adjustment becomes necessary). The coarse adjustment compensates for roughly discontinuous shifts between the actual received power and the target power level (e.g., when the target power level is adjusted, or operating conditions suddenly change), and typically entails the sending entity responding to a sequence of consecutive power-increment commands or consecutive power-decrement commands from the receiving entity. The fine adjustments generally comprise a sequence of alternating power-increment and power-decrement commands that cause the actual received power to fluctuate slightly above and below the target power level as the sending entity sequentially responds to each command.

The receiving entity monitors the error rate of transmissions received from a given sending entity according to its ability (or lack thereof) to successfully decode those received transmissions and recover the information carried therein. On the reverse link from a given access terminal to a base station, data are typically transmitted in units of frames, and the base station measures the received error rate in terms of its ability to decode individual frames. Each frame corresponds to a specific time window, and the amount of data carried in a frame depends on the particular encoding scheme employed. Decoding of received transmissions is carried out on a frame-by-frame basis, whereby a given frame is deemed in error if it is not successfully recovered by the end of the corresponding frame time window. The base station may then increase the target power level (i.e., setpoint) applied to the given access terminal in response to a single frame error or to an error rate averaged over a number of frames. In turn, the base station will issue power-increment commands to the given access terminal that cause the access terminal to increase its reverse-link transmission power, thereby improving the base station's ability to decode subsequent frames from the given access terminal.

Recent technological advances have led to improved efficiency of air interface resources of wireless communication systems. In particular, an ability to subtract various sources of noise and interference from a received transmission from a given access terminal can be applied to a period of extended frame decoding that begins when a nominal frame period ends in unsuccessful decoding. By doing so, the received frame can sometimes be successfully decoded during the extended decoding interval, thereby increasing the rate of successful reception of reverse-link data. At the end of the extended decoding interval, the target power level (setpoint) for the given access terminal may be increased if decoding was still unsuccessful or if all or most of the extended decoding interval was required to recover the frame. Alternatively, if a frame is successfully decoded sufficiently early in an extended decoding interval, the base station can retain the current target power level for the access terminal, thereby helping to avoid additional contributions to reverse-link interference that would otherwise result.

An extended decoding interval only occurs if decoding during the nominal frame period that precedes it fails to successfully decode a frame. The likelihood that an extended decoding interval will result in a successfully decoded frame will generally depend on various factors, among them the aggregate interference from transmissions of all ATs with active reverse links to the base station, and the duration of the extended decoding interval. As noted, extended decoding is based in part on subtracting signals of successfully decoded frames from those frame transmissions that are still being decoded. In general, the greater the number of potentially interfering frame transmissions that need to be subtracted during extended decoding, the smaller the likelihood of successful extended decoding. At the same time, the longer the duration of the extended decoding interval, the better the chances of subtracting sufficiently many decoded frames so as to yield success during any given extended decoding attempt. It follows that a longer extended decoding interval would be desirable when reverse-link conditions indicate a greater degree of interfering frames, and vice versa. However, the factors that impact extended decoding results are not typically under the control of the operator of a wireless communication system on a time scale over which possible adjustments could benefit extended decoding.

More particularly, aggregate reverse-link interference depends on factors that typically change with time and that are, in any case, generally beyond the control of the operator, such as the number of access terminals transmitting at any one time, the locations of the access terminals with respect to the base station, etc. Furthermore, in conventional operation, the duration of the extended decoding interval is a fixed system parameter that may be changed only from time to time by the operator of the wireless communication system. Thus, while the aggregate reverse-link interference can vary dynamically, the receiving base station cannot in conventional operation responsively adjust the duration of the extended decoding interval so as to improve or optimize the effectiveness of the interval. It would therefore be desirable to be able to dynamically adjust the duration of extended decoding based on a metric indicative of aggregate reverse-link, frame-based noise and interference.

U.S. patent application Ser. No. 12/781,898, filed May 18, 2010 and incorporated herein by reference for all purposes, discloses example embodiments of a method and system for dynamic setpoint adjustment in which the setpoint may be increased gradually over the course of an extended frame decoding. U.S. patent application Ser. No. 12/815,100, filed Jun. 14, 2010 and incorporated herein by reference for all purposes, discloses example embodiments of a method and system for enhanced setpoint adjustment whereby the current value of the setpoint is used to determine a particular time during the extended decoding interval at which the setpoint is adjusted. U.S. patent application Ser. No. 12/817,853, filed Jun. 17, 2010 and incorporated herein by reference for all purposes, discloses example embodiments for a method and system of determining the duration of an extended decoding interval based on a received signal strength from an access terminal as measured by a base station. The present disclosure describes embodiments for a method and system of determining the duration of an extended decoding interval based on an aggregate reverse-link error rate as measured by a base station (or other RAN element).

Hence in one respect, various embodiments of the present invention provide, in a base station having an air interface, a method comprising: at the base station, during a first nominal time interval equal to one frame, receiving a first transmission on the air interface from a first access terminal being served by the base station, and upon completion of the first nominal time interval, making a first determination that the first transmission has not been successfully decoded into a frame of data, wherein the completion of the first nominal time interval corresponds to a first nominal end time; at the base station, in response to making the first determination, commencing at the first nominal end time a first extended decoding interval during which attempted decoding of the first transmission continues; at the base station, determining an aggregate error rate for transmissions received from a plurality of access terminals communicating with the base station; at the base station, determining a first virtual end time of the first extended decoding interval based on the determined aggregate error rate, the determined first virtual end time being measured from the first nominal end time; and at the base station, continuing attempted decoding of the first transmission until the determined first virtual end time of the first extended decoding interval is reached.

In another respect, various embodiments of the present invention provide a base station comprising: means for receiving a first transmission on an air interface from a first access terminal being served by the base station during a first nominal time interval equal to one frame; means for making a first determination that the first transmission has not been successfully decoded into a frame of data upon completion of the first nominal time interval, wherein the completion of the first nominal time interval corresponds to a first nominal end time; means for responding to the first determination by commencing at the first nominal end time a first extended decoding interval during which attempted decoding of the first transmission continues; means for determining an aggregate error rate for transmissions received from a plurality of access terminals that communicate with the base station during a measurement interval; means for determining a first virtual end time of the first extended decoding interval based on the determined aggregate error rate, wherein the determined first virtual end time is measured from the first nominal end time; and means for continuing attempted decoding of the first transmission until the determined first virtual end time of the first extended decoding interval is reached.

In yet another respect, various embodiments of the present invention provide, non-transitory computer-readable medium of claim 23, wherein the functions further comprise: during a second nominal time interval equal to one frame, receiving a second transmission on the air interface from a second access terminal being served by the base station, and upon completion of the second nominal time interval, making a second determination that the second transmission has not been successfully decoded into a frame of data, wherein the completion of the second nominal time interval corresponds to a second nominal end time; in response to making the second determination, commencing at the second nominal end time a second extended decoding interval during which attempted decoding of the second transmission continues; determining a second virtual end time of the second extended decoding interval based on the determined aggregate error rate, wherein the determined second end time is measured from the second nominal end time; and continuing attempted decoding of the second transmission until the determined second virtual end time of the second extended decoding interval is reached.

These as well as other aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate the invention by way of example only and, as such, that numerous variations are possible. For instance, structural elements and process steps can be rearranged, combined, distributed, eliminated, or otherwise changed, while remaining within the scope of the invention as claimed.

DETAILED DESCRIPTION

The present invention will be described by way of example with reference to Code Division Multiple Access ("CDMA") communications in general, and to IS-856 and IS-2000 communications in particular. As described below, IS-2000 applies to both circuit-cellular and packet-data communications, and is referred to herein as "conventional" CDMA communications. IS-856 applies more exclusively to packet-data communications (including, e.g., real-time voice and data applications), and is referred to herein as "high rate" packet-data communications. It should be understood that the present invention can apply to other wireless voice and data protocols including, without limitation, IS-95 and GSM, which, together with IS-856 and IS-2000 are considered herein, individually or in combination, to comprise a CDMA family of protocols.

Figure 1:
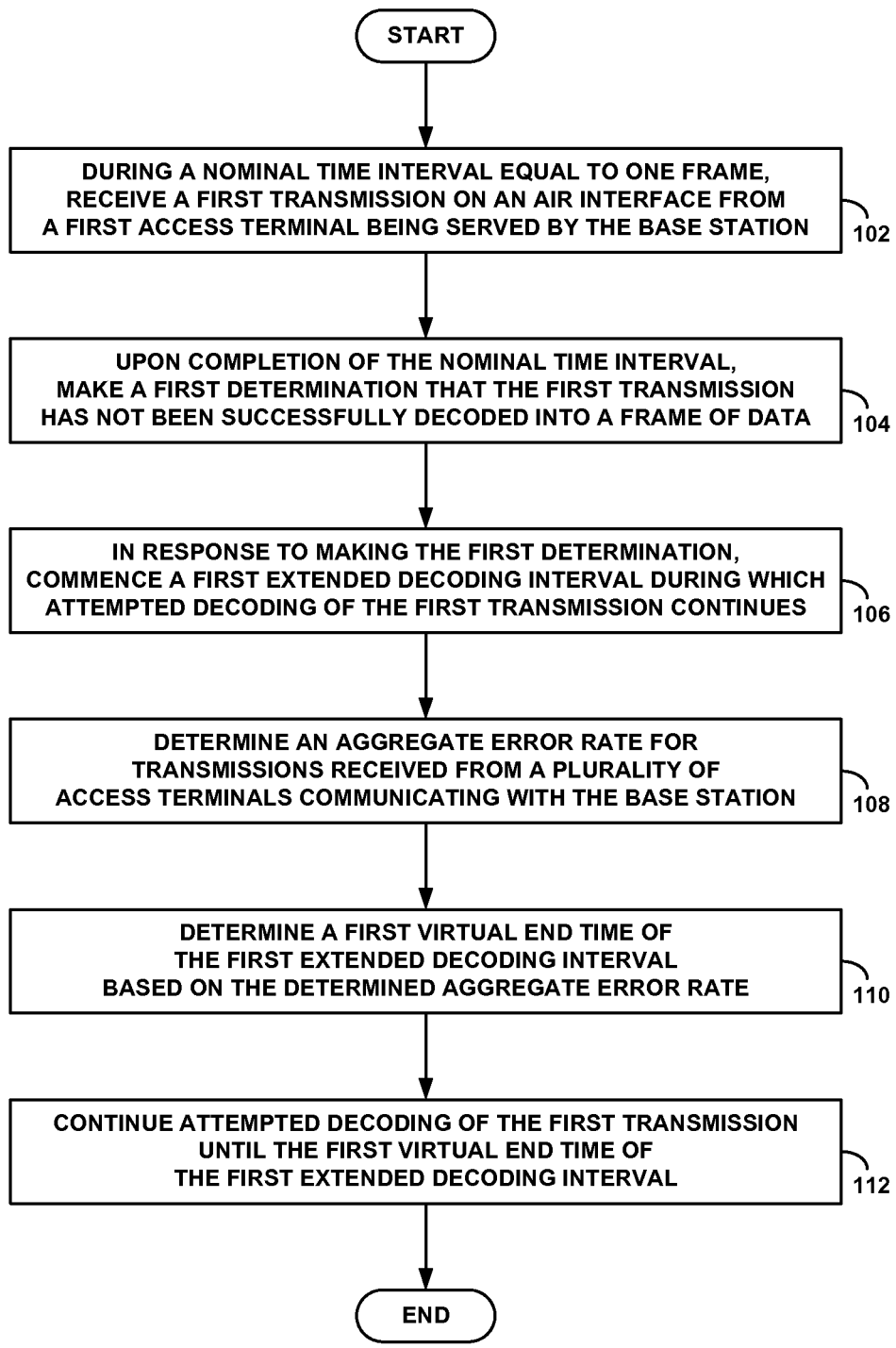
FIG. 1 is a flowchart illustrating an example embodiment of dynamic adjustment of extended frame decoding interval duration based on an aggregate reverse-link error rate.

FIG. 1 is a flowchart illustrating an example embodiment of a method of dynamic adjustment of extended frame decoding interval duration based on an aggregate reverse-link error rate. By way of example, the method could be carried out by a base station or other RAN element that operates according to a CDMA family of protocols, including at least CDMA 2000 Spread Spectrum Systems Revision E. It will be appreciated that a base station could include a BTS and a coverage area, wherein the coverage area could be at least one of a cell or a sector. Further, the base station may be considered as serving multiple access terminals that also operate according to a CDMA family of protocols. Communication between the base station and the access terminals is carried out an air interface that supports respective forward and reverse links to each access terminal.

At step 102, during a first nominal time interval equal to one frame, the base station receives a first transmission on the air interface from a first access terminal. As described above and further explained below, under IS-2000 and related protocols, an access terminal transmits data on its reverse link to its serving base station in units of frames. One frame is typically 20 milliseconds (ms) in duration, though example embodiments described herein are not limited to this frame duration. As such, the first nominal time interval of step 102, referred to herein as a first "nominal frame period," corresponds to a time window within which the base station expects the first transmission from the first access terminal to be carrying one frame of encoded data. The time instant at end of the first nominal frame period defines the first "nominal end time." In the specific context of CDMA 2000 Spread Spectrum Systems Revision E, the nominal end time is referred to as the "nominal termination target."

At step 104, upon completion of the first nominal time interval (i.e., at the end of the first nominal frame period), the base station makes a determination that the first transmission received at step 102 has not been successfully decoded into a frame of data. Ideally, the base station would have successfully decoded the first transmission into a frame of date, so the determination at step 104 of failure to decode the first transmission corresponds to a frame error. While strictly speaking, a "nominal frame period" simply defines a time interval equal to one frame (ending at the nominal termination target), for purposes of the present discussion, a nominal frame period that ends in a frame error will be referred to herein as a "failed" or "unsuccessful" nominal frame period. Conversely, a nominal frame period that ends in a successfully decoded frame will be referred to herein as a "successful" nominal frame period. This terminology reflects both the outcome of the decoding effort as well as the duration of the nominal time interval. Thus the determination at step 104 corresponds to the determination of an unsuccessful nominal frame period.

At step 106, in response to making the determination of an unsuccessful nominal frame period, the base station then commences a first extended frame decoding interval during which the base station continues to attempt to decode the first transmission received during the unsuccessful nominal frame period. In accordance with the example embodiment, the first extended frame decoding interval begins when the unsuccessful nominal frame period ends. In practice, the total duration of the first extended frame decoding interval will be less that the duration of a nominal frame period. For instance, the conventional duration of an extended frame decoding interval is typically 5-10 ms, compared with a typical nominal frame period of 20 ms. The time instant at end of the first extended frame decoding interval—i.e., the completion time of the first extended decoding interval—defines the first "virtual end time." In the specific context of CDMA 2000 Spread Spectrum Systems Revision E, the virtual end time is referred to as the "virtual termination target." Thus, the extended frame decoding interval begins at the nominal termination target of the preceding unsuccessful nominal frame period and lasts until the virtual termination target (the end time of the extended decoding interval).

At step 108, the base station determines an aggregate reverse-link error rate of frame transmissions received from a plurality of access terminals communicating with the base station. In accordance with the example embodiment, the aggregate reverse-link error rate can be determined as a ratio the number of frames received in error from the plurality of access terminals in a given time window to all frames received from the plurality of access terminals in the given time window. The determination that a given frame transmission has been received in error corresponds to a failure to decode the given frame transmission into a data frame during a decoding interval. As such, a frame received in error can be considered as corresponding to an unsuccessful nominal frame period, an unsuccessful extended decoding interval, or the former followed by the latter, depending on the specific statistics being tracked.

The precise definition of aggregate reverse-link error rate can correspondingly take slightly varying forms that emphasize different aspects of reverse-link quality. For example, the aggregate reverse-link error rate can be defined in as the ratio of the total number of unsuccessful nominal frame periods to the total of all nominal frame periods for all ATs of the plurality during the given time window. This definition provides an indication of reverse-link quality as measured by nominal frame period decoding.

Alternatively, the aggregate reverse-link error rate can be defined as the ratio of the total number of unsuccessful extended decoding intervals to the total of all extended decoding intervals for all ATs of the plurality during the given time window. This alternative definition accounts only for extended decoding intervals with the ATs of the plurality, and provides an indication of the effectiveness of extended decoding in mitigating unsuccessful nominal frame decoding.

As still a further alternative, the aggregate reverse-link error rate can be defined as the ratio of the sum of the number of unsuccessful nominal frame periods plus the number of unsuccessful extended decoding intervals to the sum of all nominal frame periods plus all extended decoding intervals for all ATs of the plurality during the given time window. This still further alternative definition accounts for all nominal and extended decoding intervals with the ATs of the plurality, and provides an indication that emphasizes the impact of extended decoding on overall reverse-link quality as measured by nominal and extended decoding.

It will be appreciated that other variations of the precise definition of aggregate reverse-link error rate could be devised as well. It will also be appreciated that the aggregate reverse-link error rate could be defined in inverse terms as an aggregate reverse-link success rate. For example, an aggregate reverse-link success rate could be defined as the ratio of the number of successful extended decoding intervals to all extended decoding intervals for all ATs of the plurality during the given time window. While the specific indications provided by success rates are inverse (or complementary) to those provided by error rates, they can nevertheless be interpreted to correspond to the same information.

At step 110, the base station determines a first virtual end time for the first extended decoding interval based on the aggregate reverse-link error rate determined at step 108. As described above, the first extended decoding interval starts at the first nominal termination target of an unsuccessful nominal frame interval, and lasts until the first virtual termination target. Hence the determination step of 110 dynamically sets the duration of the first extended decoding interval by dynamically setting the first virtual termination target. Note that the first virtual termination target is set as a time relative to the first nominal termination target. In accordance with the example embodiment, the dynamic setting of the first virtual termination target is based on the measured aggregate reverse-link error rate; that is, the base station determines the duration of the first extended decoding interval for the first access terminal based on the aggregate reverse-link error rate of frame transmissions received from the plurality of access terminals communicating with the base station.

In further accordance with the example embodiment, the determination of the duration of the first extended decoding interval based on the measured aggregate reverse-link error rate will be made so as to maintain or increase the likelihood that the first extended decoding interval will be successful, while at the same time not adopting a duration that is excessively long. More specifically, the base station will determine longer durations for higher measured aggregate reverse-link error rates, and vice versa. The determination could be made in a number of ways. For example, a functional relationship between duration values and aggregate reverse-link error rate values could be used, whereby the functional relationship specifies generally increasing values of duration for increasing values of aggregate reverse-link error rate. The functional relationship could be implemented as an algorithm in one or another form of logical instructions executable by the base station (e.g., a processor at the base station).

As another example, the base station could store a look-up table that correlates each of one or more ranges of aggregate reverse-link error rate values with a correspond value of virtual termination target. For any given measurement of aggregate reverse-link error rate (i.e., in accordance with step 108), the base station could consult the table in order to determine the virtual termination target (and hence the duration of the extended decoding interval). The table values could be established as parameters of the wireless communication system and supplied to the base station in a provisioning or configuration operation. The base station could store the table in one or another form of memory (e.g., solid state memory, disk memory, etc.).

As still an other example, the base station could determine the first virtual end time of the first extended decoding interval by reporting the aggregate reverse-link error rate measurement to a controlling entity in the wireless network, and thereafter receiving a response that includes the determined first virtual end time from the controlling entity. For example, the base station could correspond to a BTS or a BTS sector, and the controller could be a BSC or other controlling element of the RAN. The BTS could then transmit a message containing the measured aggregate reverse-link error rate to the BSC, and the BSC could determine a value for first virtual termination target and then send a response message to the BTS with the determined value.

In further accordance with the example embodiment, the determinations at step 108 and 110 can be made prior to the first nominal end time (e.g., the first nominal termination target) of the first nominal frame period. More specifically, the base station's monitoring of the aggregate reverse-link error rate (e.g., step 108) can be carried out asynchronously with respect to commencement of any given extended decoding interval, including the first extended decoding interval of step 106 of the present example. Likewise, the base station's determination of the first virtual end time based on the aggregate reverse-link error rate (e.g., step 110) can also be carried out asynchronously with respect to commencement of any given extended decoding interval, including the first extended decoding interval of step 106 of the present example. In particular, both the aggregate reverse-link error rate and the associated first virtual end time can have been determined ahead of time, such that if and when any given extended decoding interval is commenced, an appropriate value of virtual end time (e.g., virtual termination target) has already been set.

According to this asynchronous approach, the base station will periodically update its value of virtual termination target based on periodic determination of aggregate reverse-link error rate, wherein the periodicity of the update operation is longer than a nominal frame period. For example, the base station could update its value of virtual termination target every 500 nominal frame periods. In this way, the base station will advantageously adjust its virtual termination target based on dynamic conditions that prevail in the coverage area. It will be appreciated that other update periods could be used as well.

Finally, at step 112, the base station will continue attempted decoding of the first transmission from the access terminal until the first virtual end time of the first extended decoding interval. Upon completion of the first extended decoding interval, the base station will determine whether or not the previous frame transmission of the previous unsuccessful nominal frame period has now been successfully decoded. That is, the base station will determine whether or not the first extended frame decoding interval has been successful. Since the virtual termination target will have been determined based on the aggregate reverse-link error rate measurement—and in particular, the virtual termination target will have been set larger for larger values of aggregate reverse-link error rate—the likelihood of successful decoding will advantageously have been increased compared with the likelihood under conventional operation when a static (fixed) value of termination target is used.

In further accordance with the example embodiment, the steps of FIG. 1 will be applicable to a second access terminal as well. More specifically, during a second nominal time interval equal to one frame, the base station receives a second transmission on the air interface from a second access terminal. Upon completion of the second nominal time interval, the base station makes a second determination that the second transmission has not been successfully decoded into a frame of data. Here, the completion of the second nominal time interval corresponds to a second nominal end time, and the second nominal time interval is a second nominal frame period. Again, in the specific context of CDMA 2000 Spread Spectrum Systems Revision E, the second nominal end time is a second nominal termination target.

In response to making the second determination, the base station commences a second extended decoding interval during which the base station continues to attempt decoding of the second transmission continues. The base station determines a second virtual end time of the second extended decoding interval based on the same aggregate error rate determined at step 108 above. As with the first extended decoding interval, the second virtual end time is a second virtual termination target, and is measured from the second nominal termination target. The base station continues attempted decoding of the second transmission until the second virtual termination target is reached.

As noted, the base station uses a common determination of aggregate reverse-link error rate to determine the virtual termination targets for both extended decoding intervals of the above example. The aggregate reverse-link error rate can similarly be applied to dynamic adjustment of a virtual termination target for any or all access terminals with active reverse-link communications with the base station. In this manner, the efficacy of extended decoding can advantageously be maintained in the face of dynamic reverse-link conditions in a cell or sector. Moreover, the example method can be used to dynamically adjust a single virtual termination target applied in common to all access terminals in a cell or sector, or can accommodate different virtual termination targets for different access terminals in the cell or sector. In the context of the example discussed above, a single, common virtual termination target would correspond to the second virtual end time equaling the first determined virtual end time.

In the above discussions and explanations, the terms "first" and "second" as applied to "transmission," "access terminal," "nominal end time," "virtual end time," "nominal termination target," "virtual termination target," and so on, are generally used as identifying labels, and not meant to imply any numerical ordering (although a numerical ordering is not necessarily excluded).

It will also be appreciated that the steps of FIG. 1 are presented by way of example, and that additional and/or alternative steps or alternative ordering of steps could be carried out and still remain within the scope and spirit of the present invention or embodiments thereof.

Figure 2:
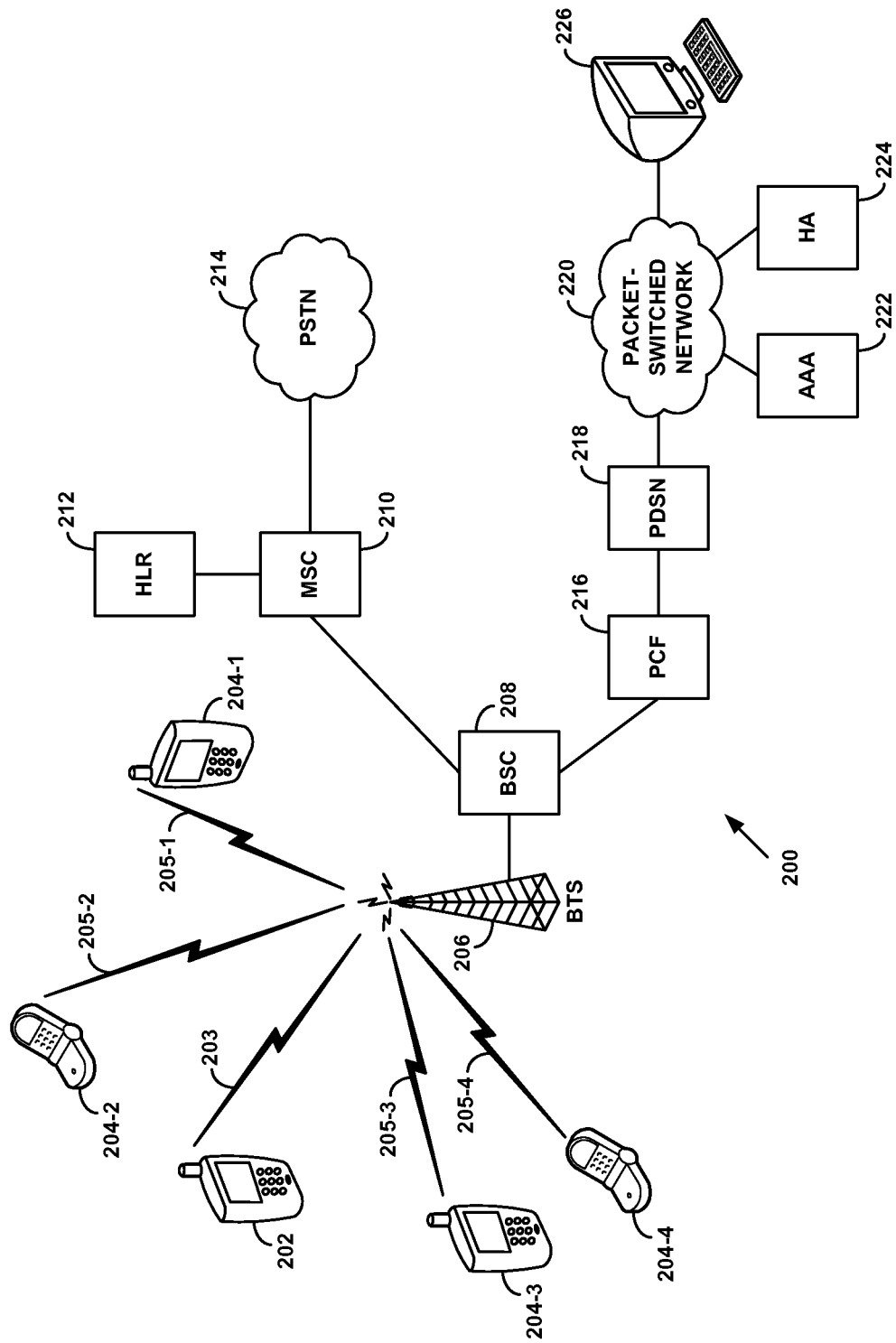
FIG. 2 is a simplified block diagram of a wireless communication system in which example embodiments of dynamic adjustment of extended frame decoding interval duration based an aggregate reverse-link error rate can be employed.

FIG. 2 shows a simplified block diagram of a wireless communication system 200 in which an example embodiment of dynamic adjustment of extended frame decoding interval duration based on an aggregate reverse-link error rate can be employed. Access terminal AT 202 communicates over an air interface 203 with a BTS 206, which is then coupled or integrated with a BSC 208. Transmissions over air interface 203 from BTS 206 to AT 202 represent the forward link to the access terminal (also referred to herein alternatively as the forward link from the base station, and as "the AT's forward link"). Transmissions over interface 203 from AT 202 to BTS 206 represent the "reverse link" (also referred to herein as "the AT's reverse link"). Four other access terminals, AT 204-1, 204-2, 204-3, and 204-4, are also depicted in FIG. 2. As indicated, they communicate with BTS 206 over air interfaces 205-1, 205-2, 205-3, and 205-4, respectively.

Each of these air interfaces is operationally similar to air interface 203, each representing at least a forward and reverse link. It will be appreciated that this arrangement is for purposes of illustration.

BSC 208 is connected to MSC 210, which acts to control assignment of air traffic channels (e.g., over air interfaces 203, 205-1, 205-2, 205-3, and 205-4), and provides access to wireless circuit-switched services such as circuit-voice and circuit-data (e.g., modem-based packet data) service. As represented by its connection to PSTN 214, MSC 210 is also coupled with one or more other MSCs or other telephony circuit switches in the operator's (or in a different operator's) network, thereby supporting user mobility across MSC regions, and local and long-distance landline telephone services. Also connected to MSC 210 is home location register (HLR) 212, which supports mobility-related aspects of subscriber services, including dynamic tracking of subscriber registration location and verification of service privileges.

As shown, BSC 208 is also connected with a PDSN 218 by way of packet control function (PCF) 216. PDSN 218 in turn provides connectivity with a packet-switched network 220, such as the Internet and/or a wireless carrier's private core packet-network. Sitting as nodes on network 220 are, by way of example, an authentication, authorization, and accounting (AAA) server 222, a mobile-IP home agent (HA) 224, and a remote computer 226. After acquiring an air traffic channel over its air interface, an access terminal (e.g., AT 202) may send a request to PDSN 218 for a connection in the packet data network. Then, following authentication of the access terminal by AAA server 220, the access terminal may be assigned an IP address by the PDSN or by HA 224, and may thereafter engage in packet-data communications with entities such as remote computer 226.

It should be understood that the depiction of just one of each network element in FIG. 2 is illustrative, and there could be more than one of any of them, as well as other types of elements not shown. The particular arrangement shown in FIG. 2 should not be viewed as limiting with respect to the present invention or embodiments thereof. Further, the network components that make up a wireless communication system such as system 200 are typically implemented as a combination of one or more integrated and/or distributed platforms, each comprising one or more computer processors, one or more forms of computer-readable storage (e.g., disks drives, random access memory, etc.), one or more communication interfaces for interconnection between elements and the network, and operable to transmit and receive the communications and messages described herein, and one or more computer software programs and related data (e.g., machine-language instructions and program and user data) stored in the one or more forms of computer-readable storage and executable by the one or more computer processors to carry out the functions, steps, and procedures of the various embodiments of the present invention described herein. Similarly, a communication device such as exemplary access terminals 202, 204-1, 204-2, 204-3, and 204-4 typically comprises a user-interface, I/O components, a communication interface, a tone detector, a processing unit, and data storage, all of which may be coupled together by a system bus or other mechanism. As such, system 200, ATs 202, 204-1, 204-2, 204-3, and 204-4, and air interfaces 203, 205-1, 205-2, 205-3, and 205-4 collectively are representative of example means of implementing and carrying out the various functions, steps, and procedures described herein.

Throughout this description, the term "base station" will be used to refer to a Radio Access Network (RAN) element such as a BTS, a BSC, or combination BTS/BSC, for instance. The term "radio network controller" (RNC) can also be used to refer to a BSC, or more generally to a base station. In some arrangements, two or more RNCs may be grouped together, wherein one of them carries out certain control functions of the group, such as coordinating handoffs across BTSs of the respective RNCs in the group. The term controlling RNC (or C-RNC) customarily applies to the RNC that carries out these (and possibly other) control functions.

1. Conventional CDMA Communications

In a conventional CDMA wireless network compliant with the well known IS-2000 standard, each cell employs one or more carrier frequencies, typically 1.25 MHz in bandwidth each, and each wireless service sector is distinguished from adjacent sectors by a pseudo-random number offset ("PN offset"). Further, each sector can concurrently communicate on multiple different channels, distinguished from each other by "Walsh codes." When an access terminal operates in a given sector, communications between the access terminal and the BTS of the sector are carried on a given frequency and are encoded by the sector's PN offset and a given Walsh code.

Air interface communications are divided into forward link communications, which are those passing from the base station to the access terminal, and reverse link communications, which are those passing from the access terminal to the base station. In an IS-2000 system, data are transmitted in units of frames on both the forward link and reverse link. On either link, communications in a given wireless service sector are encoded with the sector's PN offset and a given Walsh code. On the forward link, certain Walsh codes are reserved for use to define control channels, including a pilot channel, a sync channel, and one or more paging channels, and the remainder can be assigned dynamically for use as traffic channels, i.e., to carry user communications. Similarly, on the reverse link, one or more Walsh codes may be reserved for use to define access channels, and the remainder can be assigned dynamically for use as traffic channels.

In order to facilitate efficient and reliable handoff of access terminals between sectors, under IS-2000 an AT can communicate on a given carrier frequency with a number of "active" sectors concurrently, which collectively make up the AT's "active set." Depending on the system, the number of active sectors can be up to six (currently). When an AT is engaged in an active call or session, it may thus communicate with all of the sectors in its active set. In this mode of operation, the AT is said to be in "soft handoff." On the forward link, the access terminal in soft handoff receives largely the same signal from each of its active sectors and, on a frame-by-frame basis, selects the best signal to use. On the reverse link, the AT in soft handoff transmits the same data, frame-by-frame, to each sector in its active set.

An AT's active set is maintained in the access terminal's memory, each active sector being identified according to its PN offset. The AT continually monitors the pilot signals from its active sectors as well as from other sectors, which may vary in as the AT moves about within the wireless communication system, or as other factors cause the AT's RF conditions to change. The AT reports the received signal strengths to the serving base station, which then directs the AT to update its active set in accordance with the reported strengths and one or more threshold conditions.

As described above, frames are transmitted from the base station to the AT or from the AT to the base station at regular intervals (corresponding to a frame rate), typically 20 milliseconds in duration (although other frame intervals can be used). As a result of imperfect transmission, noise, interference, or other operational factors, some frames received by the AT on the forward link or by the base station on the reverse link may contain errors. Other frames—ideally, the majority of them—will be received without errors. It may also be possible through one or another coding technique to correct certain errors in frames.

On either link, the receiving entity (e.g., AT or base station) can compute a ratio of (i) the number of error-containing frames received during a given period of time to (ii) the total number of frames received during the same period of time. This ratio, computed by the AT on the forward link and by the base station on the reverse link, is called the frame error rate (FER). The FER is an indicator of the RF conditions of the forward and/or reverse link, and consequently the quality service provided over the respective link. For instance, frame errors may manifest as lost audio samples, which in turn cause choppy or distorted audio output when played out by a receiving device. Similarly, frame errors may represent packet-data loss that results in retransmissions and lower overall throughput. In general, the higher the FER, the lower the quality of service will be, and vice versa. For a given set of physical conditions underlying communications between a base station and an access terminal, the higher the transmission power on the link (forward or reverse), the lower the FER will be. Consequently, the quality of service provided on a link can be adjusted and/or controlled by adjusting the transmission power used on the link.

In order to support concurrent communication in multiple channels on a common frequency, each channel is allocated a fraction of the total forward-link power available in the sector. The power allocated to each channel is determined so as to optimize the signal-to-noise characteristics of all the channels, and may vary with time according to the number of access terminals being serviced, and their relative positions with respect to the BTS, among other factors. Similarly, on the reverse links, each access terminal transmits at a power level that optimizes the signal-to-noise while minimizing interference with other access terminals.

Signal-to-noise is typically measured as a ratio of "energy per chip" ("$E_c$") to total received energy ("$I_0$"), the ratio being expressed as "$E_c/I_0$." As is known in the art, a "chip" is a small unit of time (usually, sub-microsecond) over which one or another form of encoding (e.g., CDMA) and/or decoding of data are carried out (successive chips may also be considered as having binary values that are applied in encoding and decoding). The energy per chip, $E_c$, measured at a receiver corresponds to an amount of energy received from a source within a time window equal to one chip. The total energy, $I_0$, corresponds to the total energy in noise and interference received from all sources during the same time window. It will be appreciated that other specific forms the signal-to-noise ratio (SNR) can be defined as well.

In practice, the transmission power level on the air interface between the base station and any particular access terminal is typically specified as a gain level, x, according to the relation x dBm=$10 \log_{10}$ (P/1 mW), where P is the power in mW (milliwatts). The ratio, y, of two different power levels $x_1$ and $x_2$ each expressed as gain is then given by y dB=$10 \log_{10}$ ($P_1/P_2$). Accordingly, the signal-to-noise measure $E_c/I_0$ is typically expressed in dB. For reference (and by way example), y=3 dB corresponds to a factor of two in terms of absolute power.

Similar methods of power control are implemented on both the forward and reverse links. For each link, two interrelated schemes are employed, and employ a form of SNR based on energy per bit, as explained below. The first, called "inner-loop" power control, achieves rapid convergence of link power to a level corresponding to a threshold SNR. The second, called "outer-loop" power control, operates on a longer time scale (i.e., more slowly) than the inner loop, and adjusts the inner-loop threshold SNR in response to the computed FER. Thus the outer loop adjusts the SNR threshold to attain a desired quality of service (as measured by FER), while the inner loop adjusts the link power to quickly achieve (at least approximately) the SNR threshold set by the outer loop.

In discussions below, details of power control are described with reference only the reverse link; i.e., control of the AT's reverse link power by the receiving base station (or sector). Note, however, that since the protocols are similar for both the forward and reverse links, the descriptions of power control that follow apply generally to forward-link control as well (although some specific details may differ). Note also that while the discussion refers only to a single base station (or sector), the base-station operations described with regard to power control of a given access terminal are carried out in practice by all of the given access terminal's active set sectors when the given access terminal is in soft handoff.

For inner-loop power control, the base station measures (for each reverse link) SNR at a rate of 800 times per second (although other rates are possible), each SNR measurement being made in terms of $E_b/N_0$, where $E_b$ is the energy per bit of the signal received by the AT and the $N_0$ is the noise power spectral density. For each measurement, the base station compares $E_b/N_0$ with a threshold value called $(E_b/N_0)_{setpoint}$ and responsively sets and sends a power control bit to the AT in order to affect a power adjustment. Note that $(E_b/N_0)_{setpoint}$ is the same parameter referred to simply as "setpoint" in the discussion above; the terms "$(E_b/N_0)_{setpoint}$" and "setpoint" will thus be used interchangeably hereinafter.

In practice, power adjustment is applied in terms of gain relative to a current power level, and measured in dB. For $E_b/N_0 \leq (E_b/N_0)_{setpoint}$, the base station sets the power control bit to "power up," and, in conventional operation, the AT responsively increases the reverse link gain by a small amount (typically 1 dB or less). For $E_b/N_0 > (E_b/N_0)_{setpoint}$, the base station sets the power control bit to "power down," and, in conventional operation, the AT responsively decreases the reverse link gain by the same small amount. In this manner, the reverse link power rapidly converges, in small increments or decrements, to a level where $E_b/N_0 \approx (E_b/N_0)_{setpoint}$, and thereafter fluctuates about $(E_b/N_0)_{setpoint}$ until $(E_b/N_0)_{setpoint}$ is adjusted to a new value by outer-loop power control, or operating conditions change such that $E_b/N_0$ diverges from $(E_b/N_0)_{setpoint}$.

Each transmission by the base station of the power control bit set to power up is commonly referred to as a "power-up command." Similarly, each transmission of the power control bit set to power down is referred to as a "power-down command." Power-up commands are specific examples of the more generically-termed power-increment commands described above, and power-down commands are specific examples of the more generically-termed power-decrement commands described above.

For outer-loop power control on the reverse link, the base station computes the FER within consecutive calculation windows, each being an integer number of frames in duration. Thus, in each calculation window, FER may be expressed as the number of frames with errors divided by the number of frames per window. The duration of a calculation window typically ranges from one to 20 frames, although other calculation window sizes (number of frames per window) could be used. For each calculation window, the base station compares the computed FER with a reverse-link Target FER (TFER). If the computed FER is less than TFER, the base station decreases $(E_b/N_0)_{setpoint}$. Conversely, if the computed FER is greater than TFER, the base station increases $(E_b/N_0)_{setpoint}$. In this manner, a computed FER that exceeds the target FER drives the inner-loop power control to increase the reverse-link power, while a computed FER that is below the target FER drives the inner-loop power control to decrease the reverse-link power.

Note that a shorter calculation window will be more sensitive to short-term variations that effect RF conditions but will also allow the base station to react more quickly to these variations, while a longer calculation window will tend to average over short-term variations while possibly delaying responsiveness to non-transient changes in RF conditions. For a one-frame calculation window, setpoint adjustment can be sensitive to the shortest possible timescale. In this case, calculation does not directly yield an observed frame error rate, but an historical average may still be tracked. However, the setpoint adjustment applied in response to a single-frame error event can be selected such that the resulting, effective FER is maintained in close agreement with the target FER.

In the context of a CDMA family of protocols, the power control methods described in the preceding are sometimes referred to as "inner-loop power-control protocols" and "outer-loop power-control protocols." It should also be noted that additional or alternative methods of power control may be applied to either of the forward or reverse links.

With arrangement described above, an access terminal can engage in cellular voice or packet-data communications. Referring again to FIG. 2, and taking an originating call from AT 202 as an example, AT 202 first sends an origination request over air interface 203 and via the BTS 204 and BSC 206 to MSC 208. The MSC then signals back to the BSC directing the BSC to assign an air interface traffic channel for use by the access terminal. For a voice call, the MSC uses well-known circuit protocols to signal call setup and establish a circuit connection to a destination switch that can then connect the call to a called device (e.g., landline phone or another access terminal). For a packet-data session, the BSC signals to the PDSN 216 by way of PCF 214. The PDSN 216 and access terminal 202 then negotiate to establish a data link layer connection, such as a point to point protocol (PPP) session. Further, the PDSN 216 sends a foreign agent advertisement that includes a challenge value to the access terminal, and the access terminal responds with a mobile-IP registration request (MIP RRQ), including a response to the challenge, which the PDSN forwards to HA 222. The HA then assigns an IP address for the access terminal to use, and the PDSN passes that IP address via the BSC to the access terminal.

2. High Rate Packet-Data Communications

Under IS-2000, the highest rate of packet-data communications theoretically available on a fundamental traffic channel of the forward link is 9.6 kbps, dependent in part on the power allocated to the forward-link traffic channel and the resultant signal-to-noise characteristics. In order to provide higher rate packet-data service to support higher bandwidth applications, the industry introduced a new "high rate packet data (HRPD) system," which is defined by industry standard IS-856.

IS-856 leverages the asymmetric characteristics of most IP traffic, in which the forward link typically carries a higher load than the reverse link. Under IS-856, each access terminal maintains and manages an active set as described above, but receives forward-link transmission from only one active sector at a time. In turn, each sector transmits to all its active ATs on a common forward link using time division multiplexing (TDM) in order to transmit to only one access terminal at a time, but at the full power of the sector. As a result of the full-power allocation by the sector, an access terminal operating under IS-856 can, in theory, receive packet-data at a rate of at least 38.4 kbps and up to 2.4 Mbps on its forward link.

The reverse link under IS-856 retains largely the traditional IS-2000 code division multiplexing (CDM) format, albeit with the addition of a "data rate control" (DRC) channel used to indicate the supportable data rate and best serving sector for the forward link. Multiple, active ATs in a common serving sector can transmit concurrently on their respective reverse links to the sector's BTS. Each reverse link comprises distinct code channels, thereby enabling the BTS to distinguish among each AT's transmissions. As with IS-2000, the IS-856 reverse link transmissions are frame-based.

TDM access on the IS-856 forward link is achieved by dividing the forward link in the time domain into time slots of length 2048 chips each. At a chip rate of 1.228 Mega-chips per second, each slot has a duration of 1.67 milliseconds (ms). Each time slot is further divided into two 1024-chip half-slots, each half-slot arranged to carry a 96-chip pilot "burst" (pilot channel) at its center and a Medium Access Control (MAC) channel in two 64-chip segments, one on each side of the pilot burst. The remaining 1600 chips of each time slot (800 per half-slot) are allocated for a forward traffic channel or a forward control channel, so that any given time slot will carry either traffic-channel data (if any exists) or control-channel data. Traffic-channel data comprise user application data, while control-channel data comprise IS-856 control messages. As in IS-2000, each sector in IS-856 is defined by a PN offset, and the pilot channel carries an indication of the sector's PN offset. Also as in IS-2000, an access terminal operating under IS-856 monitors the pilot signal emitted by various sectors in order to facilitate active set management, i.e., as a basis to facilitate handoff from one sector to another.

Unlike the IS-856 forward link which is allocated the full power of the serving sector (or other coverage area) to each AT on a TDM basis, the power applied to the reverse link from each of possibly multiple ATs in a common serving sector is individually controlled by the base station using the same methods described above for IS-2000. In particular, for each active AT in a sector, the serving base station uses a calculated frame error rate to set an outer-loop SNR threshold (i.e., the setpoint), and, in accordance with inner-loop power control protocols, issues appropriate power-control commands—power-up or power-down commands—to cause the $E_b/N_0$ of the signal received from the AT to converge to the threshold. Under IS-856, the $E_b/N_0$ of the signal received from the AT is typically measured 600 times per second (equal to the slot rate), and responsive power-control commands are sent from the base station at the same rate.

Operation in an IS-856 compliant communication system may be illustrated, again with reference to FIG. 2. To acquire packet data connectivity under IS-856, after an access terminal first detects an IS-856 carrier, the access terminal sends to its BSC (or RNC) 206 a UATI (Universal Access Terminal Identifier) request, and receives in response an UATI, which the access terminal can then use to identify itself in subsequent communications with the BSC. The access terminal then sends a connection-request to the BSC 206, and the BSC responsively invokes a process to authenticate the access terminal and to have the access terminal acquire a data link.

In particular, the BSC 206 sends an access request to an Access Network AAA (ANAAA) server (which may be different than the AAA server 220), and the ANAAA server authenticates the access terminal. The BSC 206 then assigns radio resources for the data session, providing a MAC identifier ("MAC ID") to the AT for identifying its time-slot data sent in the forward-link traffic channel, and a Walsh code for a sending data on the reverse-link traffic channel. Further, the BSC signals to the PDSN 216 (via PCF 214), and the PDSN and access terminal then negotiate to establish a PPP data link. In addition, as in the IS-2000 process, the access terminal then sends an MIP RRQ to the PDSN, which the PDSN forwards to the HA 222, and the HA assigns a mobile-IP address for the access terminal to use.

Once the access terminal has acquired an IS-856 radio link, a data link, and an IP address, the access terminal is considered to be in an active mode. In active mode, the AT receives its data distributed across MAC-identified time slots transmitted by the BTS using the full power of the forward link of the sector selected by the AT (as described above). Thus, the access terminal recognizes its time-slot data from among other time slots by a MAC identifier included in each transmission, and processes only those time slots with the AT's assigned MAC identifier. Using the full power of the forward link maximizes the signal-to-noise ratio, thus facilitating higher rate data communication than the power-limited conventional CDMA channels.

3. Dynamic Adjustment of Extended Decoding Duration Based on Signal-to-Noise a. Operating Principles The failure of a base station to successfully decode a frame during a nominal frame period is generally attributable to some combination of imperfect transmission, noise, and interference on the reverse link. With regard to interference in particular, some or all of possibly multiple access terminals with active voice or data sessions that are being served by a common base station (or a common sector, for example) can transmit concurrently on their respective reverse links, though not generally (or necessarily) with synchronicity with respect to frame boundaries. As a consequence, the serving base station must simultaneously decode transmissions from different access terminals, wherein the nominal termination targets of the different, concurrently-transmitted frames from the different access terminals occur at different times. For a given transmission from a given access terminal during a given nominal frame period, all other received transmissions constitute interference, and can contribute to (or even be a predominant factor in) failure of the serving base station to decode the given transmission into a frame as sent by the given access terminal.

If a frame has not been successfully decoded by the end of the given nominal frame period, and attempted decoding of the given transmission ceases at the nominal termination target of the given nominal frame period, then a frame error will result. At this point, the base station may increase the setpoint applied to transmissions from the given access terminal, as described above. While this increase may aid in the decoding of a transmission from the given access terminal during the next nominal frame period, it will also increase the given access terminal's contribution to interference on other reverse links to the base station.

It may be the case that one or more concurrent transmissions from other access terminals have been successfully decoded into respective frames at some point prior to the nominal termination target of the given nominal frame period, or at some point shortly thereafter. By continuing to decode the given transmission after the nominal termination target of the given nominal frame period, while at the same time computationally subtracting (or otherwise accounting for) the now-known contributions to interference from the successfully decoded frames from the other access terminals, it is possible to still achieve successful decoding of the given transmission. Such an approach to continuing decoding after the nominal termination target is one of the features provided with the introduction of CDMA 2000 Spread Spectrum Systems Revision E, for example.

More specifically, in accordance with conventional operation under CDMA 2000 Spread Spectrum Systems Revision E (among other possible, similarly-compliant, CDMA-related protocols), upon a determination of an unsuccessful nominal frame period, the base station will continue to attempt to decode the transmission of the previous nominal frame period (that resulted in a failed decoding attempt) while concurrently attempting to decode the transmission being received during the next (new) nominal frame period. As described above, the period of continued attempted decoding of the previous transmission is referred to as an extended frame decoding interval, and lasts from the nominal termination target of the unsuccessful nominal frame period until the virtual termination target.

If decoding remains unsuccessful at the virtual termination target, the base station may then increase the setpoint applied to transmissions from the given access terminal. If the previous transmission is successfully decoded by the virtual termination target, then the base station may forgo increasing the setpoint. In this case, a possible increase in the given access terminal's contribution to interference on the reverse link may be avoided.

In conventional operation, the duration of the extended decoding interval—i.e., the virtual termination target—is a static or fixed parameter of the wireless communication system. As such, when a given frame transmission of access terminal in soft handoff fails to be decoded by any of the access terminal's active set sectors during the nominal frame interval for the given frame transmission, all of the active set sectors will invoke extended decoding intervals using the same virtual termination target.

Figure 3:
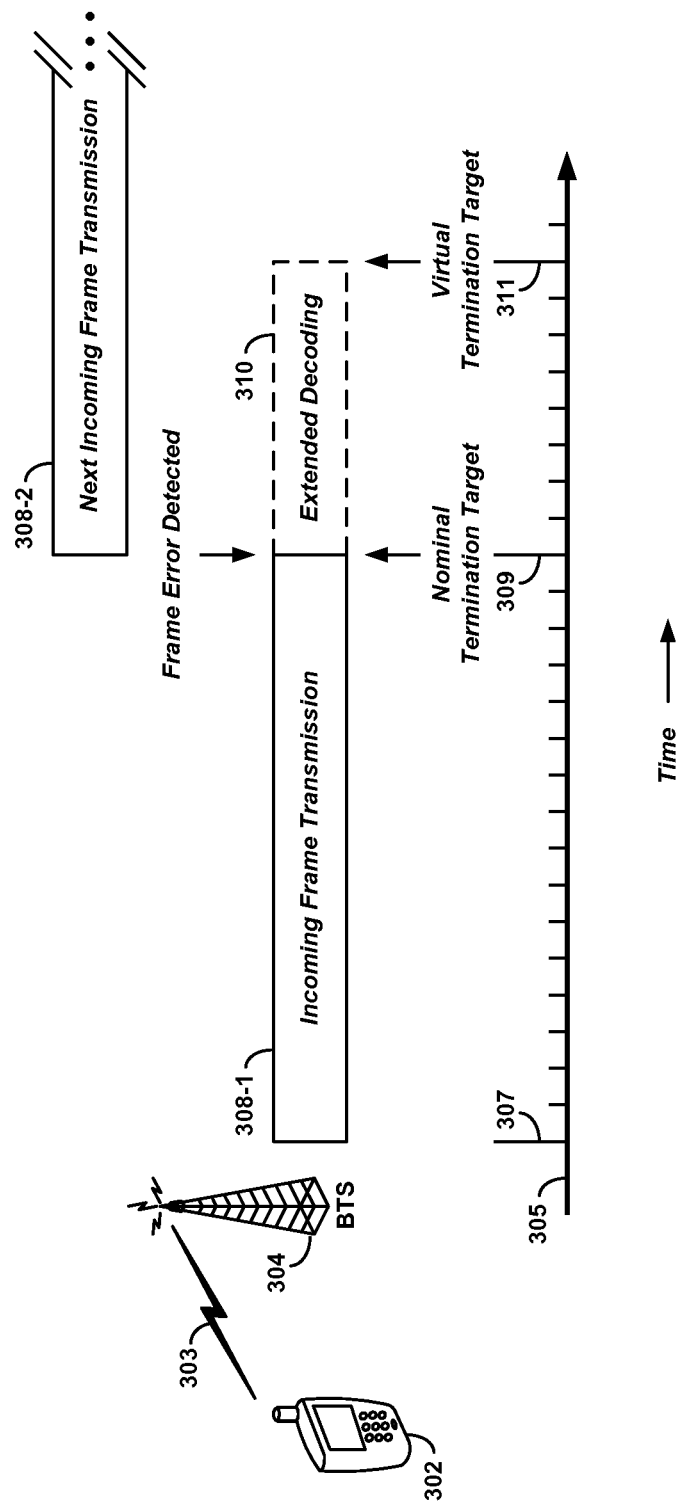
FIG. 3 illustrates an example of an extended frame decoding interval at a representative base station.

FIG. 3 illustrates an example of conventional extended frame decoding according to CDMA 2000 Spread Spectrum Systems Revision E for just one base station, represented by a BTS 304, receiving frame transmissions from a common access terminal 302. It will be appreciated that the BTS 304 could support a single cell or multiple sectors, and will typically be under the control of a BSC or RNC.

A communication link between the access terminal and the BTSs is provided by an air interface 303, represented in FIG. 3 by a lightning-bolt line. The air interface 303 supports both forward-link and reverse-link communications. In particular, the reverse link supports frame transmissions from the access terminal, and the BTS 304 (or a controlling BSC, for example) can measure a frame error rate for transmissions from the access terminal 302 on the reverse link.

To further facilitate the discussion, a timeline 305 marking increasing time towards the right is shown in the figure. The tick marks can be considered as measuring arbitrary time units. For example, they could be taken to correspond to 1X-RTT time slots. However, the tick marks could be taken to correspond to other time units as well.

As illustrated, the BTS 304 begins receiving a reverse-link frame transmission from the access terminal 302 as an incoming frame transmission 308-1 at start time 307. The nominal frame interval at the BTS 304 for the incoming frame transmission 308-1 ends at the nominal termination target 309 (as marked on the timeline 305). The next reverse-link frame transmission from the access terminal 302 then begins being received at the BTS 304 in the form of the next incoming frame transmission 308-2 (the next incoming frame is truncated with hatch marks and ellipses for the sake of brevity in the figure). At the same time, the BTS 304 determines that the nominal frame interval of the incoming frame transmission 308-1 failed to yield a successfully decoded frame; i.e., it determines that a frame error has occurred. Consequently, the BTS 304 commences an extended decoding interval 310.

In conventional operation under CDMA 2000 Spread Spectrum Systems Revision E (for example), the extended decoding interval 310 lasts for a statically-set, fixed duration. Thus, it lasts until a statically-set virtual termination target 311. The duration of the extended decoding interval 310 is not dynamically adjustable in conventional operation.

During the extended decoding interval 310, the base station (e.g., BTS 304) is continuing to attempt to decode the previous frame transmission 308-1, even though that transmission is no longer being received from the access terminal. At the same time, the base station is now receiving the next frame transmission 308-2 from the access terminal. The ability of the base station 304 to decode the previous frame transmission during the extended decoding interval depends, among other factors, on the amount of interference that was present during the previous unsuccessful nominal frame period, when the previous frame transmission 308-1 was being received. This is because extended decoding of a given previous frame transmission works, in part, by decoding and removing interfering frame transmissions that were received concurrently with during the nominal frame period of the given frame transmission. Hence, a larger number of interfering frame transmissions during a nominal frame period of a given frame transmission will make successful decoding of that given frame during an extended decoding interval more difficult, and vice versa.

It follows that effectiveness of extended decoding could be enhanced by increasing the duration of the extended decoding interval; i.e., by increasing the virtual termination target, thereby increasing the amount of time the base station has to decode and remove interfering frame transmissions. However, in conventional operation, the virtual termination target is a fixed or static system parameter. Even beyond the restriction of a fixed value of virtual termination target, there can be computing and other overhead costs associated with extended decoding. Consequently, any scheme in which dynamic adjustment of virtual termination target might be enabled would need to balance the potential benefit of adjusting the duration of extended decoding against overhead costs of doing so (e.g., computing resources). Thus, any factor applied in determining when and by how much the virtual termination target should be dynamically adjusted should also be a reasonable indicator of an expected of success rate of extended decoding. An aggregate reverse-link error rate tied to aggregate FER provides such an indicator, because frame errors are detected as decoding errors by the base station, and the aggregate rate is at least partly dependent of interference.

Accordingly, embodiments of the present invention introduce a method and system of dynamic adjustment of extended frame decoding interval duration based on an aggregate reverse-link error rate. In accordance with the example embodiment, a base station or other RAN element will monitor an aggregate reverse-link error rate of communications with a plurality of access terminals, and periodically adjust the virtual termination target applied to extended decoding intervals based on the monitored error rate. More particularly, the base station will use larger values of virtual termination target for higher aggregate reverse-link error rates and smaller values for lower aggregate reverse-link error rates.

Operation of an example embodiment of dynamic adjustment of extended frame decoding interval duration based on an aggregate reverse-link error rate is described in the next subsection.

b. Example Operation

Figure 4:
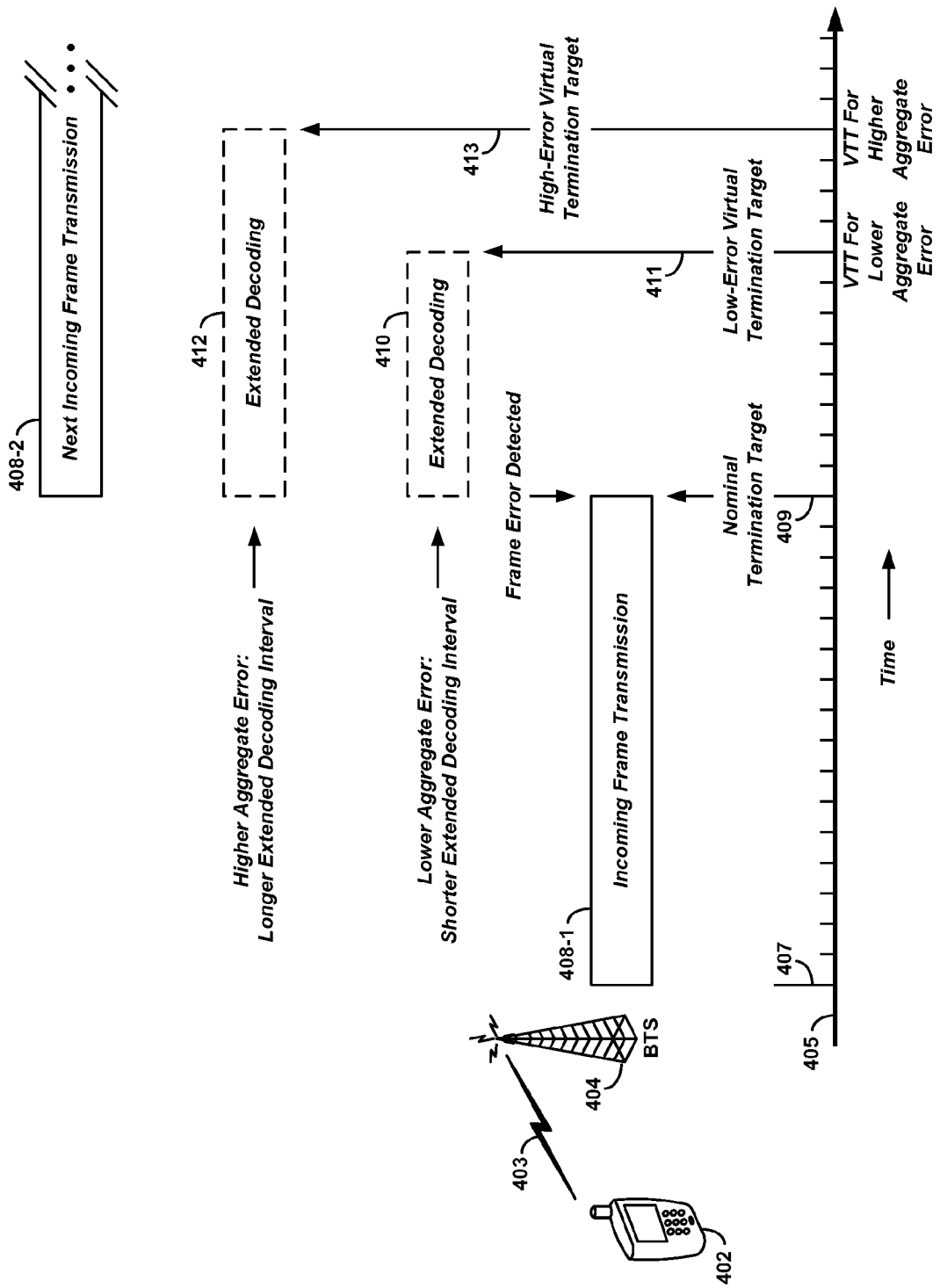
FIG. 4 illustrates an example of dynamically-adjusted extended frame decoding intervals at a representative base station, wherein the durations of the extended frame decoding intervals are determined based on an aggregate reverse-link error rate determined at the base station.

FIG. 4 illustrates operation of the example embodiment of dynamic adjustment of extended frame decoding interval duration based on an aggregate reverse-link error rate. The format displayed in FIG. 4 is largely the same as that used in FIG. 3, except that two possible extended decoding intervals are shown in FIG. 4 to illustrate dynamic adjustment of the virtual termination target. An access terminal 402 is taken to be transmitting on a reverse link 403 to a BTS 404. As with FIG. 4, the BTS 404 could support a single cell or multiple sectors, and will typically be under the control of a BSC or RNC.

As indicated by the timeline 405, the BTS 404 begins receiving a reverse-link frame transmission from the access terminal 402 as an incoming frame transmission 408-1 at start time 407. The nominal frame interval at BTS 404 for the incoming frame transmission 408-1 ends at the nominal termination target 409 (as marked on the timeline 405), and the next reverse-link frame transmission from the access terminal 402 then begins being received at the BTS 404 in the form of the next incoming frame transmission 408-2 (as in FIG. 3, the next incoming frame is truncated with hatch marks and ellipses for the sake of brevity in the figure). At the same time, the BTS 404 determines that the nominal frame interval of the incoming frame transmission 408-1 failed to yield a successfully decoded frame; i.e., it determines that a frame error has occurred. Accordingly, the BTS 404 will commence an extended decoding interval.

Unlike in conventional operation, however, the BTS 404 sets the virtual termination target for the extended decoding interval based on an aggregate reverse-link error rate. By way of illustration in the figure, two example virtual termination targets are depicted. Namely, a "Low-Error" virtual termination target (VTT) 411, and a "High-Error" virtual termination target (VTT) 413, both being measured relative to the nominal termination target 409. As shown, the VTT 411 is smaller than the VTT 413. In accordance with the example embodiment, the BTS 404 will use the VTT 411 in the case of a lower aggregate reverse-link error rate, or the VTT 411 in the case of a higher aggregate reverse-link error rate.

For purposes of illustration in FIG. 4, two extended decoding intervals are shown, but it should be understood that only one would be used in practice, depending on the aggregate reverse-link error rate. More particularly, for a smaller determined aggregate reverse-link error rate, the BTS 404 uses the smaller VTT 411, and the extended decoding interval 410 applies. For a larger determined aggregate reverse-link error rate, the BTS 404 uses the larger VTT 413, and the extended decoding interval 412 applies. For the moment, the terms "smaller" and "larger" as applied to aggregate reverse-link error rate are just relative to each other, within the context of the two possible alternatives of the illustration. A more precise definition in terms of example absolute measurements of aggregate reverse-link error rate is discussed below. For present illustrative purposes, it is evident from the figure that the duration of the extended decoding interval 412 is longer than the duration of the extended decoding interval 410.

Because the BTS 404 uses the larger VTT 413 for the higher aggregate reverse-link error rate and the smaller VTT 411 for the lower aggregate reverse-link error rate, it will advantageously have more time to attempt decoding under the particular conditions that benefit from a longer extended decoding interval. Namely, a higher aggregate reverse-link error rate is indicative of a higher degree of interference from reverse-link frame transmissions from access terminals being served by the BTS 404. Accordingly, the longer duration of the extended decoding interval 412 gives the BTS 404 more time to decode and remove interfering frame transmissions, and thereby to successfully decode the previous incoming frame transmission 408-1 during extended decoding.

Similarly, the BTS 404 will advantageously have allocated less time to attempt decoding under the particular conditions for which a shorter extended decoding interval is sufficient, or at least more appropriate. Namely, a lower aggregate reverse-link error rate is indicative of a lesser degree of interference from reverse-link frame transmissions from access terminals being served by the BTS 404. Accordingly, the shorter duration of the extended decoding interval 410 gives the BTS 404 sufficient time to decode and remove the smaller number of interfering frame transmissions, and thereby to successfully decode the previous incoming frame transmission 408-1 during extended decoding.

While a larger the virtual termination target may increase processing overhead (or other resource costs) incurred by the BTS 404 compared with a smaller virtual termination target, the increase is warranted in the case of larger aggregate reverse-link error rate because of the benefit derived. Conversely, allocating a shorter time for extended decoding (i.e., using a smaller virtual termination target) in the case of smaller aggregate reverse-link error rate advantageously helps avoid inefficient use of processing overhead (or other resource costs) associated with decoding. Accordingly, basing the determination of virtual termination target on aggregate reverse-link error rate provides a sensible rationale for dynamically adjusting the duration of extended decoding, both in terms of likelihood of success of decoding and allocation of processing resources and related overhead.

In accordance with the example embodiment, the BTS 404 (or base station or other RAN element) will carry out a procedure to dynamically adjust the virtual termination target independently of any particular nominal or extended decoding interval. More specifically, the BTS 404 will continuously monitor an aggregate reverse-link error rate, and periodically adjust the virtual termination target applied to all extended decoding intervals based on the monitored rate, as described above. For example, the BTS 404 could determine the aggregate reverse-link error rate as a ratio frame errors to frames received from a plurality of access terminals being served within a sliding time window.

By way of example, the sliding time window can be momentarily fixed at a particular reference time instant while the BTS tallies a number of frame errors from among a total number of frame transmissions received from the plurality of access terminals during the window, and accordingly computes a aggregate reverse-link error rate as the ratio of the number of frame errors to the total number. The computed aggregate reverse-link error rate can then be used to determine an update value of virtual termination target. By periodically sliding the window to successive reference time instants, the BTS can thereby periodically adjust the virtual termination target. In the time between each computation and adjustment, the BTS will apply the most recently adjusted virtual termination target to all extended decoding intervals.

As discussed above, different particular forms of aggregate reverse-link error rate can be computed the by varying the specific types of frames included in the error-rate ratio. For example, a ratio of all unsuccessful nominal frame periods to all frame transmissions received from the plurality of access terminals during the time window reflects overall reverse-link quality. Alternatively, a ratio of all unsuccessful extended decoding intervals to all extended decoding intervals the plurality of access terminals during the time window reflects the success rate of extended decoding. As a further alternative, a ratio of the sum all unsuccessful nominal frame periods plus all unsuccessful extended decoding intervals to the sum of all nominal frame periods plus all extended decoding intervals the plurality of access terminals during the time window reflects the impact of extended decoding on the overall reverse-link quality. Any of these forms, and possibly others, of aggregate reverse-link error rate could be applied in the example embodiment.

In further accordance with the example embodiment, the BTS could use a functional relation between aggregate reverse-link error rate and duration value to determine the virtual termination target. More particularly, a functional relation could be devised algorithmically to yield an output value of virtual termination target for a given input value of aggregate reverse-link error rate. The functional relation would give generally increasing values of duration for increasing values of aggregate reverse-link error rate, and could be implemented in the form of logical instructions stored in a computer-readable medium and executable by the BTS (e.g., a processor at the BTS, BSC or other base station element).

Figure 5:
FIG. 5 illustrates an example Look-Up Table for correlating measured aggregate reverse-link error rates with duration of an extended decoding interval.

In yet further accordance with the example embodiment, the BTS will use a form of look-up table to determine the virtual termination target from aggregate reverse-link error rate. More specifically, the BTS will maintain a table that correlates particular values of virtual termination target with ranges of aggregate reverse-link error rate. FIG. 5 depicts an example of such a "Virtual Termination Target Look-Up Table" 500. As illustrated, the look-up table 500 has one column that lists five ranges of values of aggregate reverse-link error rate, designated r, in increasing order from a minimum value range of $r \leq 0.01$ to a maximum value range of $x > 0.10$. As noted, r=(Frame Errors)/(All Frames), and could correspond to any of the ratio definitions discussed above. The table 500 also has a second, column that lists five corresponding virtual termination values (in millisecond) in increasing order from a minimum value of 2 ms to a maximum value of 10 ms. For example, a measured value of aggregate reverse-link error rate of 0.04 would fall in the range $0.03 < r \leq 0.05$, and, according to the table, corresponds to a virtual termination target of 6 ms. It will be appreciated that the neither present invention or embodiments thereof are limited to the specific values listed in look-up table 500, and that more or fewer values and/or different values of aggregate reverse-link error rate and virtual termination target could be used.

The look-up table 500 (or a similar data structure) could be stored in one or another form of physical memory of the base station, such as magnetic disk, "random access memory" (RAM), or the like. In operation, the base station (or other determining entity) could consult the stored table in order to determine the virtual termination target that should be used for a given determined value of aggregate reverse-link error rate. More specifically, the base station could look up the virtual termination target based on the measured aggregate reverse-link error rate during any given sliding time window.

4. Implementation of Example Embodiments

The example embodiment of dynamic adjustment of extended frame decoding interval duration based on aggregate reverse-link error rate described above can be implemented as a method in a base station (e.g., sector, BTS, BSC, RNC, etc.) that is part of a wireless communication system that operates according to a CDMA family of protocols, such as the one described above in connection with FIG. 2. The next subsection provides logical steps and operations of the method of an example embodiment of dynamic adjustment of extended frame decoding interval duration based on aggregate reverse-link error rate. Example means for carrying out the method in a base station are described in the subsequent subsection.

a. Example Method

Figure 6:
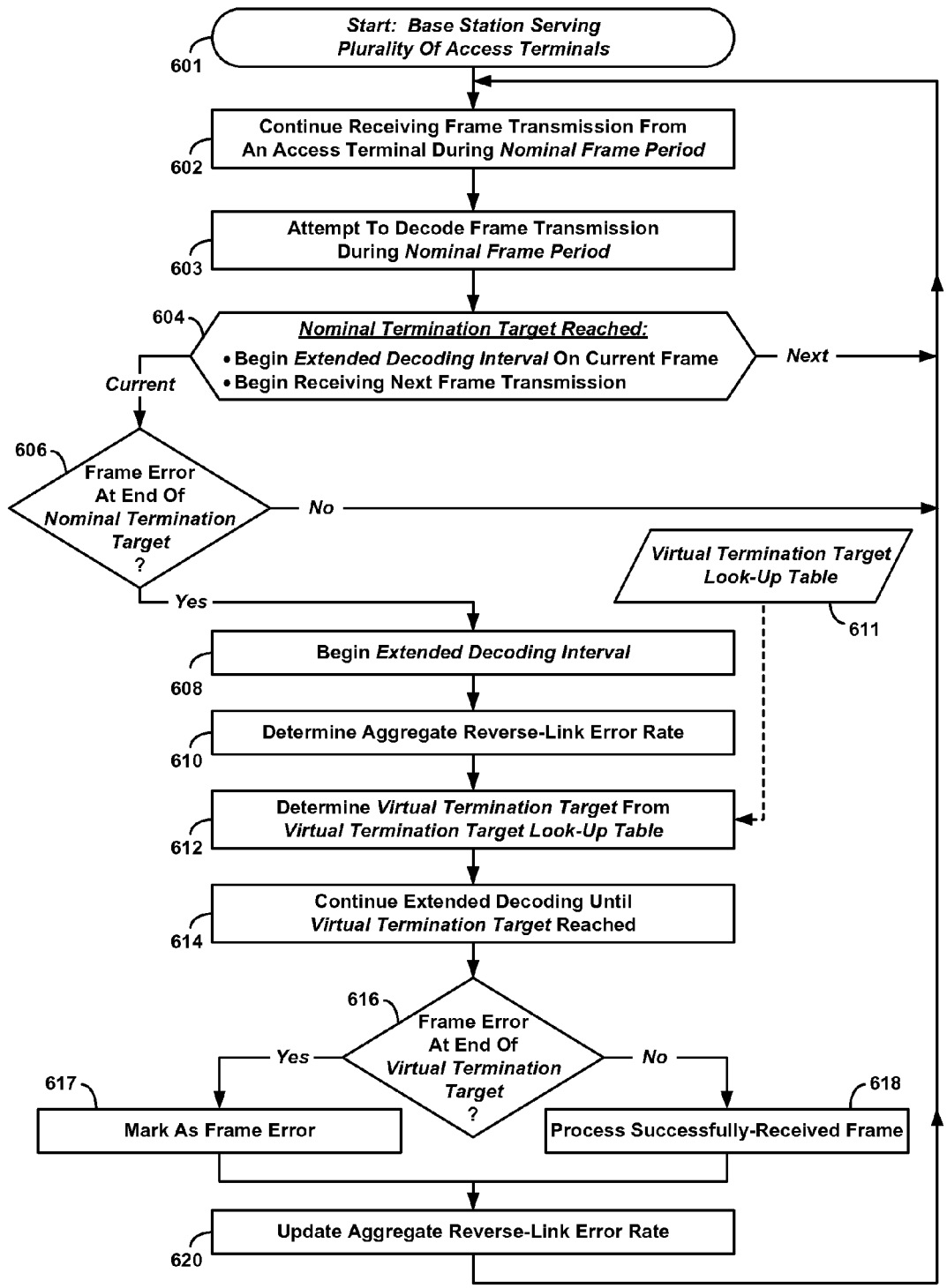
FIG. 6 illustrates an example of logical process steps for implementing an embodiment of dynamic adjustment of extended frame decoding interval duration based on an aggregate reverse-link error rate.

FIG. 6 depicts an example method carried out by a base station of the example embodiment of dynamic adjustment of extended frame decoding interval duration based on aggregate reverse-link error rate in the form of a logical flowchart. The steps could be implemented as software, firmware, and/or hardware instructions stored in physical memory of a base station, and executed by one or more general purpose and/or special purpose processors.

At the start 601 the base station is serving a plurality of access terminals in an active voice or data sessions. In particular, the base station will be receiving frame transmissions from the access terminals of the plurality on respective reverse links. This is indicated at step 602 where the base station continues to receive a frame transmission from one of the access terminals during a current nominal frame period for the access terminal.

At step 603, the base station attempts to decode the frame transmission during the current nominal frame period. Note that the separation between steps 602 and 603 of receiving the frame transmission and decoding is made for the purpose of discussion. In practice, the two operations may be carried out concurrently, which could be indicated by combining steps 602 and 603.

Step 604 marks the point in time at which the nominal termination target for the current nominal frame period is reached. At this point, the base station begins receiving the next incoming frame transmission from the access terminal in the next nominal frame period. This is indicated by the arrow from step 604 labeled "Next" that returns to step 602. Concurrently with the start of the next incoming frame, the base station also begins an extended decoding interval for the current frame—i.e., the incoming frame transmission that just completed at the nominal termination target. This is indicated by the arrow from step 604 labeled "Current" that points to step 606. For purposes of the present discussion, the term "current frame" shall refer to the just-finished frame transmission, which corresponds to the nominal frame period that ended at step 604 as the next one began.

At step 606, the base station determines if a frame error occurred. That is, the base station determines whether or not the current frame transmission was successfully decoded into a frame by the time of the nominal termination target. If no frame error occurred ("No" branch from step 606), then the process returns to step 602, where the next frame transmission continues to be received. Note that this corresponds a successful nominal frame period, so that no extended decoding interval needs to be carried out. In this case, the extended decoding interval referenced in step 604 never actually happens, except to determine that extended decoding is not needed.

If a frame error has occurred ("Yes" branch from step 606), then the process moves to step 608, wherein the extended decoding interval commences. In this case, the preceding nominal frame period was unsuccessful, so an extended decoding interval is carried out for the current frame.

At step 610, the base station determines the aggregate reverse-link error rate. This could be achieved as discussed above, for example, according to one of the forms of ratios of error rates.

At step 612, the virtual termination target is determined based on the aggregate reverse-link error rate. In accordance with the example embodiment, the determination is made by consulting a Virtual Termination Target Look-Up Table 611. For instance, the Virtual Termination Target Look-Up Table 611 could correspond to the Table 500 described above. A dotted arrow pointing from a Virtual Termination Target Look-Up Table 611 to step 612 represents the look-up action that results in the determination of the virtual termination target.

Note that while the determinations step 610 and 612 appear in sequence following the commencement of the extended decoding interval at step 608, the determination of aggregate reverse-link error rate and the determination of virtual termination target based on the aggregate reverse-link error rate could, in practice, be carried out as a separate or parallel process. For example, the base station could engage in a periodic process of monitoring the aggregate reverse-link error rate and dynamically adjusting the virtual termination target. In this case, steps 610 and 612 (and consultation of Virtual Termination Target Look-Up Table 611) could just be representative of consulting the latest, dynamically-set value of virtual termination target.

At step 614, the base station continues the extended decoding interval until the virtual termination target is reached, and then determines at step 616 if there is a frame error. Since the determination is made at the virtual termination target, step 616 corresponds to a determination of the success (or lack thereof) of the extended decoding interval.

If a frame error has occurred ("Yes" branch from step 616), the frame error is noted at step 617. If a frame error has not occurred ("No" branch from step 616), the successfully-received frame is processed at step 618. For example, the data are extracted and passed to a higher protocol layer. After either of steps 617 or 618, the aggregated reverse-link error rate updated at step 620 according to the appropriate statistic (i.e., success for failure of decoding as determined at step 616). The process then returns to step 602, where the next frame transmission continues to be received.

It will be appreciated that the steps shown in FIG. 6 are meant to illustrate operation of an example embodiment of dynamic adjustment of extended frame decoding interval duration based on aggregate reverse-link error rate. As such, various steps could be altered or modified, and the ordering of certain steps could be changed, while still achieving the overall desired operation.

b. Example Base Station

Figure 7:
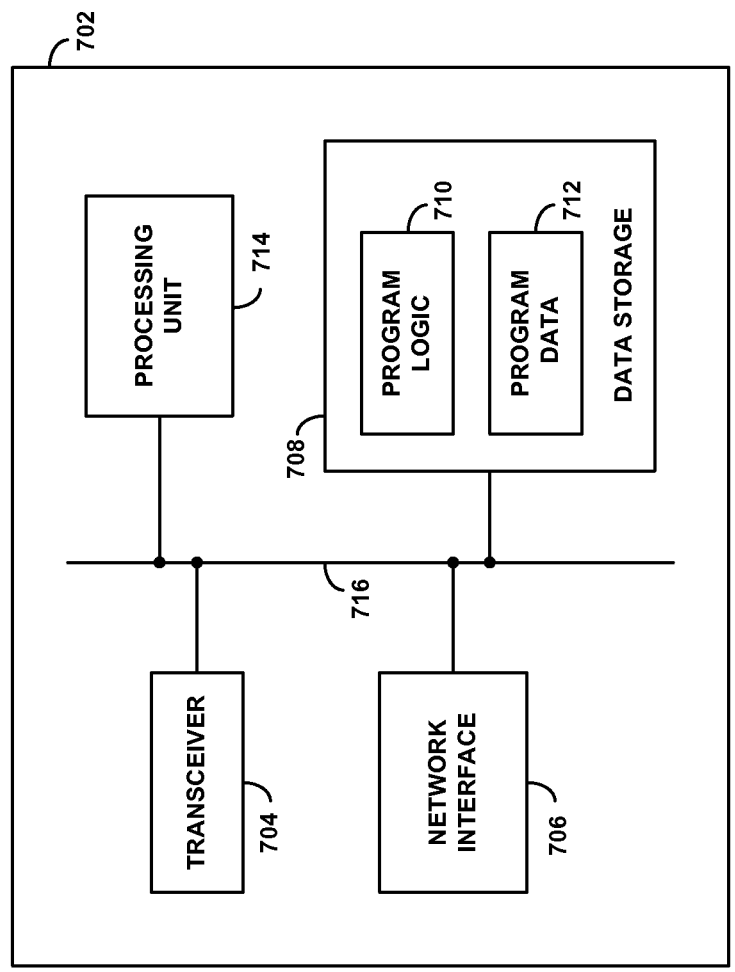
FIG. 7 is a block diagram of an example base station (or other RAN element) in which dynamic adjustment of extended frame decoding interval duration based on an aggregate reverse-link error rate could be implemented.

FIG. 7 is a simplified block diagram depicting functional components of an example base station (or BTS) 702 in which dynamic adjustment of extended frame decoding interval duration based on aggregate reverse-link error rate may be implemented according, for example, to the example method described above. As shown in FIG. 7, the example base station 702, representative of BTS 204, BSC 206 integrated with BTS 204 FIG. 2, for instance, includes a transceiver 704, network interface 706, a processing unit 714, and data storage 708, all of which may be coupled together by a system bus 716 or other mechanism. In addition, the base station may also include external storage, such as magnetic or optical disk storage, although this is not shown in FIG. 7.

These components may be arranged to support conventional operation in a wireless communication network that is compliant with a CDMA family of protocols, such as network 200 illustrated in FIG. 2. The details of such an arrangement and how these components function to provide conventional operation are well-known in the art, and are not described further herein. Certain aspects of base station 702 relevant to dynamic adjustment of extended frame decoding interval duration based on aggregate reverse-link error rate are discussed briefly below.

Network interface 706 enables communication on a network, such network 200. As such, network interface 706 may take the form of trunk or optical link that can be coupled with a TDM switch such as MSC 208, or an Ethernet network interface card or other physical connection that can be coupled with PCF 214, for instance. Further, network interface 706 in combination with transceiver 704, which may include one or more BTS antennas, enables air interface communication one or more access terminals, supporting reception of data frames on the ATs' reverse links and user traffic and control on the ATs' forward links.

Processing unit 714 comprises one or more general-purpose processors (e.g., INTEL microprocessors) and/or one or more special-purpose processors (e.g., dedicated digital signal processor, application specific integrated circuit, etc.). In turn, the data storage 708 comprises one or more volatile and/or non-volatile storage components, such as magnetic or optical memory or disk storage. Data storage 708 can be integrated in whole or in part with processing unit 714, as cache memory or registers for instance. As further shown, data storage 708 is equipped to hold program logic 710 and program data 712.

Program logic 710 may comprise machine language instructions that define routines executable by processing unit 714 to carry out various functions described herein. In particular the program logic, communication interface, and transceiver may operate cooperatively to carry out logical operation such as that discussed above and illustrated in FIG. 6. Further, program data 712 may be arranged to store a Virtual Termination Target Look-Up Table, such as the example table illustrated in FIG. 5, and other data in conjunction with the logical operations described above.

It will be appreciated that there can be numerous specific implementations of dynamic adjustment of extended frame decoding interval duration based on aggregate reverse-link error rate in base station, such base station 702 illustrated in FIG. 7. Additionally, base station 702 could be considered as representative of a single device, such as a sector or BTS, at which both measurement of aggregate reverse-link error rate and determination of extended decoding duration are carried out. Alternatively, base station 702 could be considered as representative of each of two devices, such as a BTS and a BSC or RNC, wherein aggregate reverse-link error rate is measured at the BTS and reported to the BSC or RNC, and wherein the BSC or RNC determines the appropriate extended decoding interval duration and sends the determined duration back to the BTS. Further, one of skill in the art would understand how to devise and build such an implementation. As such, base station 702 is representative of means for carrying out the methods of dynamic adjustment of extended frame decoding interval duration based on aggregate reverse-link error rate in accordance with the functions and steps described herein by way of example.

5. Conclusion

An exemplary embodiment of the present invention has been described above. Those skilled in the art will understand, however, that changes and modifications may be made to this embodiment without departing from the true scope and spirit of the invention, which is defined by the claims.

What is claimed:

1. In a base station having an air interface, a method comprising:
at the base station, during a first nominal time interval equal to one frame, receiving a first transmission on the air interface from a first access terminal being served by the base station, and upon completion of the first nominal time interval, making a first determination that the first transmission has not been successfully decoded into a frame of data, wherein the completion of the first nominal time interval corresponds to a first nominal end time;
at the base station, in response to making the first determination, commencing at the first nominal end time a first extended decoding interval during which attempted decoding of the first transmission continues;
at the base station, determining an aggregate error rate for transmissions received from a plurality of access terminals communicating with the base station;
at the base station, determining a first virtual end time of the first extended decoding interval based on the determined aggregate error rate, the determined first virtual end time being measured from the first nominal end time; and
at the base station, continuing attempted decoding of the first transmission until the determined first virtual end time of the first extended decoding interval is reached.

2. The method of claim 1, further comprising:
at the base station, during a second nominal time interval equal to one frame, receiving a second transmission on the air interface from a second access terminal being served by the base station, and upon completion of the second nominal time interval, making a second determination that the second transmission has not been successfully decoded into a frame of data, wherein the completion of the second nominal time interval corresponds to a second nominal end time;
at the base station, in response to making the second determination, commencing at the second nominal end time a second extended decoding interval during which attempted decoding of the second transmission continues;
at the base station, determining a second virtual end time of the second extended decoding interval based on the determined aggregate error rate, the determined second virtual end time being measured from the second nominal end time; and
at the base station, continuing attempted decoding of the second transmission until the determined second virtual end time of the second extended decoding interval is reached.

3. The method of claim 2, wherein the determined second virtual end time equals the first determined virtual end time.

4. The method of claim 1, wherein determining the aggregate error rate for transmissions received from the plurality of access terminals communicating with the base station comprises determining the aggregate error rate prior to commencing at the first nominal end time the first extended decoding interval,
and wherein determining the first virtual end time of the first extended decoding interval based on the determined aggregate error rate comprises determining the first virtual end time of the first extended decoding interval prior to commencing at the first nominal end time the first extended decoding interval.

5. The method of claim 1, wherein determining the aggregate error rate for transmissions received from the plurality of access terminals communicating with the base station comprises:
determining a ratio of a total number of unsuccessfully decoded data frames from the plurality of access terminals to a total number of all data-frame transmissions from the plurality of access terminals.

6. The method of claim 1, wherein determining the aggregate error rate for transmissions received from the plurality of access terminals communicating with the base station comprises:
engaging in one or more respective extended decoding intervals with each of one or more access terminals of the plurality of access terminals; and
determining how many of all of the one or more respective extended decoding intervals fail to result in a successfully decoded frame of data.

7. The method of claim 1, wherein determining the first virtual end time of the first extended decoding interval based on the determined aggregate error rate comprises determining a duration of the first extended decoding interval based on a functional relationship between duration values and error-rate values, whereby according to the functional relationship, the duration values increase with increasing error-rate values.

8. The method of claim 1, wherein determining the first virtual end time of the first extended decoding interval based on the determined aggregate error rate comprises determining the first virtual end time from a look-up table that correlates each of one or more ranges of error-rate values with a corresponding value of virtual end time.

9. The method of claim 1, wherein the base station is configured to operate according to a CDMA family of protocols, including CDMA 2000 Spread Spectrum Systems Revision E,
and wherein the first nominal end time corresponds to a nominal termination target, and the determined first virtual end time corresponds to a virtual termination target.

10. The method of claim 9, wherein the base station comprises a BTS and a coverage area, the coverage area being at least one of a cell and a sector,
and wherein determining the aggregate error rate for transmissions received from a plurality of access terminals communicating with the base station comprises:
engaging in one or more respective extended decoding intervals with each of one or more access terminals of the plurality of access terminals that are communicating with the coverage area, each of the one or more respective extended decoding intervals lasting until a respective virtual termination target; and
determining how many of all of the one or more respective extended decoding intervals fail to result in a successfully decoded frame of data.

11. The method of claim 1, further comprising:
upon completion of the first extended decoding interval at the determined first virtual end time, determining whether the first transmission has been successfully decoded into a frame of data.

12. A base station comprising:
one or more processors;
memory accessible by the one or more processors; and
computer-readable instructions stored in the memory that upon execution by the one or more processors cause the base station to carry out functions including:
receiving a first transmission on an air interface from a first access terminal being served by the base station during a first nominal time interval equal to one frame,
making a first determination that the first transmission has not been successfully decoded into a frame of data upon completion of the first nominal time interval, wherein the completion of the first nominal time interval corresponds to a first nominal end time,
responding to the first determination by commencing at the first nominal end time a first extended decoding interval during which attempted decoding of the first transmission continues,
determining an aggregate error rate for transmissions received from a plurality of access terminals that communicate with the base station during a measurement interval,
determining a first virtual end time of the first extended decoding interval based on the determined aggregate error rate, wherein the determined first virtual end time is measured from the first nominal end time, and
continuing attempted decoding of the first transmission until the determined first virtual end time of the first extended decoding interval is reached.

13. The base station of claim 12, wherein the functions further include:
receiving a second transmission on the air interface from a second access terminal being served by the base station during a second nominal time interval equal to one frame during a second nominal time interval equal to one frame;
making a second determination that the second transmission has not been successfully decoded into a frame of data upon completion of the second nominal time interval, wherein the completion of the second nominal time interval corresponds to a second nominal end time;
responding to the second determination by commencing at the second nominal end time a second extended decoding interval during which attempted decoding of the second transmission continues;
determining a second virtual end time of the second extended decoding interval based on the determined aggregate error rate, wherein the determined second virtual end time is measured from the second nominal end time; and
continuing attempted decoding of the second transmission until the determined second virtual end time of the second extended decoding interval is reached.

14. The base station of claim 13, wherein the determined second virtual end time equals the first determined virtual end time.

15. The base station of claim 12, wherein determining the aggregate error rate for transmissions received from the plurality of access terminals that communicate with the base station during the measurement interval comprises determining the aggregate error rate prior to commencing at the first nominal end time the first extended decoding interval,
and wherein determining the first virtual end time of the first extended decoding interval based on the determined aggregate error rate comprises determining the first virtual end time of the first extended decoding interval prior to commencing at the first nominal end time the first extended decoding interval.

16. The base station of claim 12, wherein determining the aggregate error rate for transmissions received from the plurality of access terminals that communicate with the base station during the measurement interval comprises:
determining a ratio of a total number of unsuccessfully decoded data frames from the plurality of access terminals to a total number of all data-frame transmissions from the plurality of access terminals.

17. The base station of claim 12, wherein determining the aggregate error rate for transmissions received from the plurality of access terminals that communicate with the base station during the measurement interval comprises:
  engaging in one or more respective extended decoding intervals with each of one or more access terminals of the plurality of access terminals; and
  determining how many of all of the one or more respective extended decoding intervals fail to result in a successfully decoded frame of data.

18. The base station of claim 12, wherein determining the first virtual end time of the first extended decoding interval based on the determined aggregate error rate comprises determining a duration of the first extended decoding interval based on a functional relationship between duration values and error-rate values, whereby according to the functional relationship, the duration values increase with increasing error-rate values.

19. The base station of claim 12, wherein determining the first virtual end time of the first extended decoding interval based on the determined aggregate error rate comprises determining the first virtual end time from a look-up table that correlates each of one or more ranges of error-rate values with a corresponding value of virtual end time.

20. The base station of claim 12, wherein the base station is configured to operate according to a CDMA family of protocols, including CDMA 2000 Spread Spectrum Systems Revision E,
  and wherein the first nominal end time corresponds to a nominal termination target, and the determined first virtual end time corresponds to a virtual termination target.

21. The base station of claim 20, wherein the base station comprises a BTS and a coverage area, the coverage area being at least one of a cell and a sector,
  and wherein determining the aggregate error rate for transmissions received from the plurality of access terminals that communicate with the base station during the measurement interval comprises:
  engaging in one or more respective extended decoding intervals with each of one or more access terminals of the plurality of access terminals that communicate with the coverage area during the measurement interval, wherein each of the one or more respective extended decoding intervals lasts until a respective virtual termination target; and
  determining how many of all of the one or more respective extended decoding intervals fail to result in a successfully decoded frame of data.

22. The base station of claim 12, wherein the functions further include:
  determining whether the first transmission has been successfully decoded into a frame of data upon completion of the first extended decoding interval at the determined first virtual end time.

23. A non-transitory computer-readable medium having stored thereon computer-executable instructions that, if executed a processor of a base station, cause the base station to perform functions comprising:
  during a first nominal time interval equal to one frame, receiving a first transmission on an air interface from a first access terminal being served by the base station, and upon completion of the first nominal time interval, making a first determination that the first transmission has not been successfully decoded into a frame of data, wherein the completion of the first nominal time interval corresponds to a first nominal end time;
  in response to making the first determination, commencing at the first nominal end time a first extended decoding interval during which attempted decoding of the first transmission continues;
  determining an aggregate error rate for transmissions received from a plurality of access terminals that communicate with the base station during a measurement interval;
  determining a first virtual end time of the first extended decoding interval based on the determined aggregate error rate, wherein the determined first virtual end time is measured from the first nominal end time; and
  continuing attempted decoding of the first transmission until the determined first virtual end time of the first extended decoding interval is reached.

24. The non-transitory computer-readable medium of claim 23, wherein the functions further comprise:
  during a second nominal time interval equal to one frame, receiving a second transmission on the air interface from a second access terminal being served by the base station, and upon completion of the second nominal time interval, making a second determination that the second transmission has not been successfully decoded into a frame of data, wherein the completion of the second nominal time interval corresponds to a second nominal end time;
  in response to making the second determination, commencing at the second nominal end time a second extended decoding interval during which attempted decoding of the second transmission continues;
  determining a second virtual end time of the second extended decoding interval based on the determined aggregate error rate, wherein the determined virtual end time is measured from the second nominal end time; and
  continuing attempted decoding of the second transmission until the determined second virtual end time of the second extended decoding interval is reached.

25. The non-transitory computer-readable medium of claim 23, wherein the base station is configured to operate according to a CDMA family of protocols, including CDMA 2000 Spread Spectrum Systems Revision E,
  wherein the base station comprises a BTS and a coverage area, the coverage area being at least one of a cell and a sector,
  wherein the first nominal end time corresponds to a nominal termination target, and the determined first virtual end time corresponds to a virtual termination target,
  and wherein determining the aggregate error rate for transmissions received from the plurality of access terminals that communicate with the base station during the measurement interval comprises:
  engaging in one or more respective extended decoding intervals with each of one or more access terminals of the plurality of access terminals that communicate with the coverage area during the measurement interval, wherein each of the one or more respective extended decoding intervals lasts until a respective virtual termination target; and
  determining how many of all of the one or more respective extended decoding intervals fail to result in a successfully decoded frame of data.

* * * * *